(12) United States Patent
Mokrushin

(10) Patent No.: US 10,127,913 B1
(45) Date of Patent: Nov. 13, 2018

(54) METHOD OF ENCODING OF DATA STREAM, METHOD OF DECODING OF DATA STREAM, AND DEVICES FOR IMPLEMENTATION OF SAID METHODS

(71) Applicant: SIF Codec LLC, San Diego, CA (US)

(72) Inventor: Vsevolod Mokrushin, Moscow (RU)

(73) Assignee: SIF CODEC LLC, San Diego, CA (US)

( * ) Notice: Subject to any disclaimer, the term of this patent is extended or adjusted under 35 U.S.C. 154(b) by 0 days.

(21) Appl. No.: 15/644,279

(22) Filed: Jul. 7, 2017

(51) Int. Cl.
  *G10L 19/00* (2013.01)
  *G10L 19/002* (2013.01)
  *H04N 19/13* (2014.01)

(52) U.S. Cl.
  CPC ........ *G10L 19/0018* (2013.01); *G10L 19/002* (2013.01); *H04N 19/13* (2014.11)

(58) Field of Classification Search
  CPC combination set(s) only.
  See application file for complete search history.

(56) References Cited

U.S. PATENT DOCUMENTS

| | | | | |
|---|---|---|---|---|
| 2006/0013493 | A1* | 1/2006 | Yang | H03M 7/4006 382/232 |
| 2015/0334425 | A1* | 11/2015 | He | H04N 19/91 375/240.03 |
| 2016/0353113 | A1* | 12/2016 | Zhang | H04N 19/13 |

OTHER PUBLICATIONS

Filho et al.; Universal Image Compression Using Multiscale Recurrent Patterns With Adaptive Probability Model; IEEE Transactions on Image Processing; Year 2008, vol. 17, Issue: 4; pp. 512-527.*
Weinberger et al.; LOCO-I: a low complexity, context-based, lossless image compression algorithm; Data Compression Conference, 1996, DCC '96. Proceedings; Year 1996; pp. 140-149.*

* cited by examiner

*Primary Examiner* — Abul Azad
(74) *Attorney, Agent, or Firm* — Nath, Goldberg & Meyer; Jerald L. Meyer

(57) ABSTRACT

A method of decoding of syntactic elements of a data stream is disclosed where, before beginning of decoding of the data stream, cells of all context models are initialized with predefined values, so that each context model contains in each cell data on a probability and a counter of a context occurrence number. A number of cells stored in each context model is selected to be not less than a number of all possible states of context elements associated with a respective context model. The process of decoding of at least a portion of bits of the data stream includes, among other steps: selecting a group of context models; calculating values of at least two context elements; extracting data on the probability from the selected cell of the selected context module; updating data in the selected cell; and carrying out a procedure of probability inheritance.

68 Claims, 14 Drawing Sheets

| Abs. Value | Bit string | |
|---|---|---|
| | unary binarization | inverse unary binarization |
| 1 | 0 | 1 |
| 2 | 1 0 | 0 1 |
| 3 | 1 1 0 | 0 0 1 |
| 4 | 1 1 1 0 | 0 0 0 1 |
| 5 | 1 1 1 1 0 | 0 0 0 0 1 |
| 6 | 1 1 1 1 1 0 | 0 0 0 0 0 1 |
| 7 | 1 1 1 1 1 1 0 | 0 0 0 0 0 0 1 |
| 8 | 1 1 1 1 1 1 1 0 | 0 0 0 0 0 0 0 1 |
| 9 | 1 1 1 1 1 1 1 1 0 | 0 0 0 0 0 0 0 0 1 |
| 10 | 1 1 1 1 1 1 1 1 1 0 | 0 0 0 0 0 0 0 0 0 1 |
| 11 | 1 1 1 1 1 1 1 1 1 1 0 | 0 0 0 0 0 0 0 0 0 0 1 |

| Abs. Value | Bit string | |
|---|---|---|
| | exponential-Golomb code | Elias gamma code |
| 0 | 1 | not defined |
| 1 | 0 1 0 | 0 |
| 2 | 0 1 1 | 1 0 0 |
| 3 | 0 0 1 0 0 | 1 0 1 |
| 4 | 0 0 1 0 1 | 1 1 0 0 0 |
| 5 | 0 0 1 1 0 | 1 1 0 0 1 |
| 6 | 0 0 1 1 1 | 1 1 0 1 0 |
| 7 | 0 0 0 1 0 0 0 | 1 1 0 1 1 |
| 8 | 0 0 0 1 0 0 1 | 1 1 1 0 0 0 0 |
| 9 | 0 0 0 1 0 1 0 | 1 1 1 0 0 0 1 |
| 10 | 0 0 0 1 0 1 1 | 1 1 1 0 0 1 0 |

*Fig. 1*

| Abs. Value | Probability | Huffman tree | Bit string |
|---|---|---|---|
| 1 | 0.1 | | 1 0 1 1 |
| 2 | 0.2 | | 0 1 |
| 3 | 0.05 | | 1 0 1 0 1 |
| 4 | 0.06 | | 1 0 0 1 |
| 5 | 0.3 | | 1 1 |
| 6 | 0.02 | | 1 0 0 0 1 1 |
| 7 | 0.03 | | 1 0 1 0 0 |
| 8 | 0.01 | | 1 0 0 0 1 0 |
| 9 | 0.03 | | 1 0 0 0 0 |
| 10 | 0.2 | | 0 0 |

*Fig. 2*

METHOD OF ENCODING OF DATA STREAM, METHOD OF DECODING OF DATA STREAM, AND DEVICES FOR IMPLEMENTATION OF SAID METHODS

BACKGROUND OF THE INVENTION

This invention relates to entropy encoding and decoding of data and may be applied e.g. in applications for compression of video data, images and/or sound data.

Entropy encoding is a form of lossless data compression. Lossless compression is an attempt of transforming discrete data into a lower number of bits than in source data without any loss of information. Lossless compression is the final step in lossy encoding of multimedia data when a source image, video data or sound data is first converted by lossy methods, and then obtained data is additionally compressed by entropy compression.

Let's suppose that there is a bit string, and for every bit thereof a probability of the bit to be in a certain state $p_i$ may be calculated. From the theory of information encoding it follows that the optimal method of encoding of a state of the current bit is encoding of this state by a bit code with a length L equal to an information entropy of a given event:

$$L = -\log_2 p_i [1]. \quad (A1)$$

There exist various methods of such transformation, and it is considered that arithmetic encoding [4] and range encoding [3] are most effective. Thus, the task of optimal encoding may be reduced to the task of optimal prediction of the probability of the given state of a coded bit to appear.

In the process of lossy compression, source data are transformed by a plurality of methods, such as, for example, discrete cosine transform, Fourier transform, a motion compensation between frames, switching of block sizes, data quantization [5]. Also, the SIF-transformation (steerable interpolation and filtration), as described in [6], may be used for data compression. For correct decoding of obtained data said data should be written into an output data stream in a strictly defined way. This method of data transfer to an output data stream is uniquely set by a compression method and is called as a syntax of a stream. An individual number, as transferred to the output data stream, is called a syntactic element [5].

FIG. 3 shows a typical layout diagram of a known video encoder. Source data is transformed by several different lossy methods. In the result, heterogeneous data is received at an input of a syntactic encoder (305), said heterogeneous data being, e.g., encoder control data (301), quantized transformation results (302), intraframe prediction data (303), motion vector data (304). The syntactic encoder (305) transforms said heterogeneous data into a single data stream of syntactic elements (306) which is transferred to one or more entropy coders (307) that perform entropy encoding and further transfer compressed data to an output bitstream (308).

FIG. 4 shows a typical decoder of compressed data. An input bitstream (401) is transferred to an input of one or more entropy decoders (402) that transfer decoded data (403) to an input of a syntactic decoder (404). The syntactic decoder selects heterogeneous data from the input bitstream (401), such as decoder control data (405), intraframe transformation data (406), quantized transformation results (407), motion vector data (408). The heterogeneous decoded data thus obtained is used for further decoding of video data.

Syntactic elements may have a various number of states set in the data stream syntax. If the number of states for a current syntactic element is more than 2, then, prior to entropy encoding, said current syntactic element should be transformed into a binary string. This transformation process is called binarization, and it may be performed by a plurality of methods [1], [2], [5], [13]. The efficiency of lossless compression and computational complexity of the obtained compression method depends directly on the binarization methods used.

One of the binarization methods is unary encoding [1] (see FIG. 1), wherein a positive integer (101) is binarized by a direct (corresponds to (102)) or inverse (corresponds to (103)) method into a respective number of bits, or a respective bit string (102, 103), equal to a value of said integer. This method enables to fully indentify dependencies in encoded data, but slows down operation of a codec.

Another method is binarization with the use of a universal code [1], such as the exponential-Golomb code (exp-Golomb code) [1], wherein a source data stream comprising a zero value (104) is transformed into a bit string (105) of variable length. Another possible universal code is the Elias gamma code [1] that may transform natural numbers (104) into a bit string (106) of variable length. An advantage of binarization with the use of the universal codes is easy software implementation and rather high efficiency of operation of the codec, but binarization with the use of the universal codes may not be optimal for several data types.

There exists a method of quasi-optimal binarization of syntactic elements which significantly accelerates an entropy codec for a preselected typical data set (FIG. 2). According to this method, a probability (202) is calculated for every state of a syntactic element (201) with the use of the typical data set. Then, for all possible states of an encoded syntactic element a Huffman tree (203) is built [1], and variable length (204) [1] codes are calculated, which uniquely set rules of bypassing the tree built. A disadvantage of this method is complexity of its implementation and its nonoptimality for encoding data having another statistical distribution than that of the typical data set.

Usually, a syntactic element set to be encoded with the use of entropy compression comprises complex interdependencies. If these dependencies are considered optimally then the probability of every state of the syntactic element in the formula (A1) may be predicted more accurately, and, due to this, an increase in compression efficiency may be achieved. Furthermore, a binarization method used directly influences quality of probability prediction and general compression efficiency.

A method for improving the probability prediction is known, wherein a probability of occurrence of a certain state is predicted depending on a value of symbols decoded so far. This methodology is called the context statistical modeling [7], [8]. A context model stores in its cells a probability distribution of a coded state depending on some number called "context" (FIG. 5, 6). A number of cells in the context model should not be less than a number of possible context states.

When encoding, one cell is selected from a context model (502) with the use of a value of context data (501). A probability stored in a selected cell (503) is used for encoding of a current bit value in input data (504) by an entropy coder (505). Coded data as output data (506) is transferred to an output data stream. After encoding, the probability in the selected cell is updated by a model updater (507) with due regard to the coded data bit value [7], [8], [9].

When decoding, one cell is selected from a context model (602) with the use of a value of context data (601). A probability stored in a selected cell (603) is used for decoding data obtained from input data (604) by an entropy decoder (605). Decoded data as output data (606) is transferred to an output data stream. After decoding, the probability in the selected cell is updated by a model updater (607) with due regard to the decoded bit value [7], [8], [9].

The context may be calculated by various methods from earlier decoded data and a location of the decoded bit in the data stream [9], [10], [11], [12], [13], [14], [15]. In order to improve compression efficiency, when calculating the context it is necessary to use such data that is most correlated with the coded state of the syntactic element. Generally, the more context size, the higher the probability evaluation accuracy is. However, if a context model is too large and the amount of data is small, statistics for each cell of the context model has not enough time to get accumulated, and the quality of prediction decreases. Therefore, there is a clear association between an optimal size of the context and the amount of the coded data. For improving the compression efficiency, an adaptive switching between the context models of different size may be used [16], [17].

The closest analogs to the present invention are technical solutions described in [16], [17]. According to said known technical solutions, switching between the context models of different size may be performed either when an encoded data stream achieves a certain bit rate, or when an advantage of changing over to the context model of a larger size is calculated. Switching of the context models when the encoded data stream has achieved the certain bit rate is inefficient, since individual statistics of the coded contexts is not accounted for. An optimal threshold for such switching differs in different cells and depends on statistics accumulated in the context models. In an improved variant of the solutions according to [16], [17], in the processes of encoding and decoding it is necessary to continuously check an advantage from using the context models of various sizes. Furthermore, additional computational operations are required both when encoding and decoding, and such check may be performed for the earlier encoded data rather than for the currently encoded data (since a value of the latter is not known to a decoder), which does not always leads to optimal solutions.

According to the present invention, the criteria of switching between the context models are fully different from those used in [16], [17], which enables to individually switch the type of the context model used for every context and thereby reduce computational complexity both for encoder and decoder.

SUMMARY OF THE INVENTION

The objective of the present invention is to improve efficiency of compression of multimedia data, such as images, video and/or audio data, by improving quality of context modeling in the entropy encoding process.

The essence of the invention is in selection of a group of context models depending on the type of decoded syntactic elements of a data stream and/or on the value of already decoded data.

According to the first aspect of the invention, in a method of decoding of syntactic elements of a data stream, before starting decoding of said data stream, cells of all context models are initialized with predefined values, so that each context model in each cell thereof contains data on a probability and a counter of a context occurrence number, and a number of cells stored in each context model is selected to be not less than a number of all possible states of context elements associated with a respective context model.

In the process of decoding of at least a portion of bits of the data stream, a group of context models comprising at least two context models of different size; values of at least two context elements associated with the selected group of context models are calculated; the cells are selected in each context model by means of values of the context elements associated with the respective context model; one context model is selected from the group of context models using values of individual counters of a context occurrence number which are stored in the selected cells; the data on the probability is extracted from the selected cell of the selected context model, which data on the probability is used for entropy decoding of a current bit in the data stream and/or for selecting a mode of direct extraction of decoded bits from the data stream; data in the selected cell of the selected context model as well as in all the context models of the group of context models, which have a size greater than that of the selected context model, is updated; and a procedure of probability inheritance from the selected context model is carried out for the selected cells of the context models from the group of context models for which predefined inheritance criteria are met.

If it is impossible to determine the value of at least one context element for some bits of the data stream, the values for such context elements are determined by predefined values.

At least one context model may have the size of $2^i$ cells, where i is a natural number.

Preferably, the procedure of selecting the context model from the group of context models is carried out by successively viewing values of individual counters of a context occurrence number in the selected cells, starting from the biggest context model and until a value of the current individual counter of a context occurrence number becomes greater than a predefined value, or until the smallest context model is reached.

Preferably, the procedure of selecting the context model from the group of context models is carried out by successively viewing the values of the individual counters of a context occurrence number in the selected cells, starting from the smallest context model and until the value of the individual counter of a context occurrence number becomes less than a predefined value, or until the biggest context model is reached.

A step of updating the value of the probability in the context may be changed depending on the value of the counter of a context occurrence number for this context.

Preferably, after the counter of a context occurrence number reaches one or more predefined values, a method of updating the probability is to be changed for this context, wherein a total number of the methods of updating the probability is more than one.

Preferably, after the counter of a context occurrence number reaches the predefined value, updating of values of the counter of a context occurrence number for this context is stopped.

Before starting the process of decoding, at least one context model in at least one group of context models may be initialized with data read from the data stream.

It is worth mentioning that only nonbinary syntactic elements are to be debinarized. Immediately after decoding, binary syntactic elements may be used for calculating the context elements and are transferred to the data stream. Debinarization is an additional step of the process of decoding, which is performed only for the nonbinary syntactic elements. If the data stream consists of the encoded binary syntactic elements only, no debinarization is carried out. A binarized string is a result of decoding of a binarized syntactic element by the entropy decoder. In the process of debinarization, the nonbinary syntactic element is generated from a binarized bit string. Debinarization relates to the variant of decoding with the binarized syntactic elements presented in the encoded data stream, but generally such elements may be absent. If the encoded data stream comprises at least one nonbinary syntactic element for which the process of binarization was carried out during encoding, it is preferable that debinarization of the nonbinary syntactic elements is carried out in the process of decoding. Furthermore, preferably, at least one context element is calculated using a current ordinal number of the decoded bit of the binarized string, from which binarized string debinarization of said context element is carried out.

Thus, the nonbinary syntactic elements of the data stream may be debinarized in the process of decoding.

Preferably, in the process of decoding, at least one decoded syntactic element is debinarized, and at least two groups of context models are selected using a current ordinal number of the bit in a binarized string.

Preferably, in the process of decoding, at least one decoded syntactic element is debinarized, and at least one context element is calculated using values of the already decoded bits of the binarized string.

Preferably, in the process of decoding, at least one decoded syntactic element is debinarized, and at least two groups of the context models are selected using values of the already decoded bits of the binarized string.

Preferably, in the process of decoding, at least one decoded syntactic element is debinarized, and at least one context element is calculated using values of earlier decoded and restored syntactic elements and/or values of earlier decoded and debinarized bits of the current syntactic element.

Preferably, in the process of decoding, at least one decoded syntactic element is debinarized, and at least two groups of context models are selected using values of the earlier decoded and restored syntactic elements and/or values of the earlier decoded and debinarized bits of the current syntactic element.

In order to debinarize at least one syntactic element it is preferable to use a predefined Huffman tree.

In order to debinarize at least one syntactic element, depending on the values of the already decoded bits of the syntactic element, two or more independent debinarization methods may be used. Therewith, it is preferable to calculate at least two context elements with the use of binarized values obtained by various binarization methods, and/or calculate at least one context element by the current ordinal number of the decoded bit in the binarized string from which the current syntactic element is debinarized. Alternatively, it is preferable to select at least two groups of context models using the binarized values obtained by various binarization methods and/or select at least two groups of context models by the current ordinal number of the decoded bit in the binarized string from which the current syntactic element is debinarized.

Preferably, decoding of the bit string encoded with the unary codes, and/or Huffman codes, and/or Golomb codes, and/or universal codes in various combinations is used as the methods of debinarization.

In order to debinarize and decode values of the syntactic elements with a sign, it is preferable to use decoding of a zero attribute by the unary method, or decoding of a sign attribute by the unary method, or decoding, by the unary method or decoding of an value of the syntactic element by the unary method or the Huffman method, provided that said absolute value is not equal to zero and does not exceed, in an absolute value, a predefined absolute value, or decoding of the absolute values which are greater than a predefined value by the Elias gamma code method or the Golomb exponential code method. Therewith, in order to restore the sign of the current syntactic element which is not equal to zero, it is preferable to change the sign of the decoded value in accordance with the decoded sign attribute.

Preferably, at least a portion of the decoded syntactic elements forms a one-dimensional array, and/or a two-dimensional array, and/or a three-dimensional array. Therewith, at least one context element is calculated on the basis of a position of the decoded syntactic element in said arrays. Alternatively, at least two groups of context models are selected on the basis of a position of the decoded syntactic element position in said arrays.

Preferably, at least one context element is calculated using values of the earlier decoded syntactic elements.

Preferably, at least two groups of context models are selected using values of the earlier decoded syntactic elements.

Preferably, at least one syntactic element, depending on a value of at least one context element associated therewith, and/or depending on calculated values of the probability, and/or depending on a value of the individual counter of a context occurrence number is read from the data stream directly, bypassing the step of decoding. Furthermore, the value of at least one context element, and/or the value of at least one probability, and/or the value of at least one counter of a context occurrence number are updated with the use of the obtained value of the syntactic element.

Preferably, at least one syntactic element, depending on the value of at least one context element associated therewith, is decoded from the data stream with the use of a predefined fixed value of the probability.

The decoded data stream may comprise the syntactic elements of various types. Furthermore, preferably at least two groups of context models are selected on the basis of the type of the decoded syntactic element.

Preferably, at least one bit of the currently decoded and debinarized syntactic element, depending on the value of at least one context element associated therewith, and/or depending on the calculated values of the probability, and/or depending on the value of the individual counter of a context occurrence number is read from the data stream directly, bypassing the step of decoding. Furthermore, the value of at least one context element, and/or the value of at least one probability, and/or the value of at least one counter of a context occurrence number are updated with the use of the value of the bit obtained.

Preferably, at least one bit of the currently decoded and debinarized syntactic element, depending on the value of at least one context element associated therewith, is decoded from the data stream with the use of predefined fixed values of the probability.

It is preferable to use an arithmetic decoder and/or range decoder for entropy decoding.

Another aspect of the present invention is a method for encoding of syntactic elements of a data stream, wherein, prior to encoding of the data stream, cells of all context models are initialized with predefined values, so that each context model in each cell thereof contains data on a probability and a counter of a context occurrence number, a number of the cells stored in each context model is selected to be not less than a number of all possible states of the context elements associated with the respective context model. In the process of encoding of at least a portion of bits of the data stream, a group of context models is selected that comprises at least two context models of different size; values of at least two context elements associated with the selected group of context models are calculated; the cells are selected in the context models using values of the context elements associated with the respective context model; one context model is selected from the group of context models using values of individual counters of a context occurrence number stored in the selected cells; the data on the probability is extracted from the selected cell of the selected context model, which data is used for entropy encoding of a current bit of the data stream, and/or for selecting a mode of writing encoded bits into the data stream directly; data in the selected cell of the selected context model as well as in all the context models of the group of context models, which have a size greater than that of the selected context model, is updated; and a procedure of probability inheritance from the selected context model is carried out in respect of the selected cells of those context models of the group of context models for which predefined inheritance criteria are met.

If it is impossible to determine the value of at least one context element for some bits of the data stream, it is preferable to determine the values of such context elements by predefined values.

At least one context model may have the size of $2^i$ cells, where i is a natural number.

The procedure of selecting the context model from the group of context models is preferably carried out by successively viewing values of the individual counters of a context occurrence number in the selected cells, starting from the biggest context model and until the value of the individual counter of a context occurrence number becomes greater than a predefined value, or until the context model of the least size is reached.

The procedure of selecting the context model from the group of context models is preferably carried out by successively viewing values of the individual counters of a context occurrence number in the selected cells, starting from the smallest context model and until the value of the individual counter of a context occurrence number becomes less than a predefined value or until the context model of the biggest size is reached.

Preferably, a step of updating the value of the probability in the context is changed depending on the value of the counter of a context occurrence number for this context.

Preferably, after the counter of a context occurrence number reaches one or more predefined values, a method of updating the probability is to be changed for this context, wherein a total number of the methods of updating the probability is more than one.

Preferably, after the counter of a context occurrence number reaches a predefined value, updating the values of the counter for a context occurrence number for this context is stopped.

Preferably, before starting the process of encoding, at least one context model in at least one group of context models is initialized with data written into an output data stream.

At least one nonbinary syntactic element of an input data stream may be binarized in the process of encoding.

In the process of encoding at least one encoded syntactic element may be binarized. Additionally, at least two groups of context models are preferably selected using a current ordinal number of the bit in the binarized string. Alternatively, at least one context element may be calculated using values of the already encoded bits in the binarized string.

Alternatively, at least two groups of context models may be selected using the values of the already encoded bits in the binarized string. Alternatively, at least one context element may be calculated using the values of the syntactic elements encoded so far and/or the values of the already encoded bits of the current syntactic element. Alternatively, at least two groups of context models may be selected using the values of the syntactic elements encoded so far and/or the values of the already encoded bits of the current syntactic element.

Preferably, in order to binarize at least one syntactic element, a predefined Huffman tree may be used.

Two or more independent binarization methods may be used for binarizing at least one syntactic element, depending on the values of the already encoded bits of the syntactic element. Here, at least two context elements are preferably calculated with the use of the binarized values obtained by various binarization methods, and/or at least one context element is calculated using the current ordinal number of the encoded bit in the binarized string obtained from the current syntactic element. Alternatively, at least two groups of context models are preferably selected using the binarized values obtained by various binarization methods, and/or at least two groups of context models are selected by the current ordinal number of the encoded bit in the binarized string obtained from the current syntactic element.

For example, the unary encoding, and/or encoding according to the Huffman method, and/or encoding by the Golomb code, and/or encoding by the universal code may be used in various combinations as the binarization methods.

For binarization and encoding of values of the syntactic elements with a sign may be used any of the following methods: unary encoding of a zero attribute; or unary encoding of the sign; or encoding of an absolute value of the syntactic element by the unary method or the Huffman method, provided that value is not equal to zero and does not exceed, in absolute value, a predefined value; or encoding of absolute values which are greater than a predefined quantity, by the Elias gamma code method or by the Golomb exponential code method.

At least a portion of the encoded syntactic elements may form a one-dimensional array, and/or a two-dimensional array, and/or a three-dimensional array, and then at least one context element is calculated on the basis of a position of the encoded syntactic element in said arrays. Alternatively, at least two groups of context models are selected on the basis of a position of the encoded syntactic element in said arrays.

Preferably, at least one context element is calculated using values of the syntactic elements encoded so far.

Preferably, at least two groups of context models are selected using the values of the syntactic elements encoded so far.

At least one syntactic element, depending on the value of at least one context element associated therewith, and/or depending on calculated values of the probability, and/or depending on a value of the individual counter of a context occurrence number may be written into the data stream directly, bypassing the step of encoding.

At least one syntactic element, depending on the value of at least one context element associated therewith, may be encoded into the data stream using a predefined fixed value of the probability.

If the encoded data stream comprises the syntactic elements of various types, preferably at least two groups of context models are selected on the basis of the type of the encoded syntactic element.

Preferably, at least one bit of the currently encoded and binarized syntactic element, depending on the value of at least one context element associated therewith, and/or depending on calculated values of the probability, and/or depending on the value of the individual counter of the context occurrence number, is written into the data stream directly, bypassing the step of encoding.

Preferably, at least one bit of the currently encoded binarized syntactic element, depending on the value of at least one context element associated therewith, is encoded into the data stream with the use of predefined fixed values of the probability.

It is preferable to using arithmetic encoder and/or range encoder for the entropy encoding.

Yet another aspect of the invention is a decoder for decoding of syntactic elements of a data stream for carrying out the claimed methods of decoding of the syntactic elements of the data stream. The decoder comprises an entropy decoder, a binarized data buffer, a decoded data buffer, a context model group selector, a context model group repository, a context model group processor, context element formers, a model update module, a context mixing module.

The decoder may further comprise a debinarizer for debinarization of binarized syntactic elements.

Still another aspect of the invention is an encoder for encoding of syntactic elements of a data stream for carrying out the claimed methods of encoding of the syntactic elements of the data stream. The encoder comprises an entropy coder, an input data buffer, a binarized data buffer, a context model group selector, a context model group repository, a context model group processor, context element formers, a model update module, a context mixing module.

The encoder may further comprise a binarizer for binarization of nonbinary syntactic elements.

Below, possible embodiments of the invention will be described with reference to the accompanying drawings.

BRIEF DESCRIPTION OF THE DRAWINGS

FIG. 1 shows a layout diagram of binarization by the unary encoding method.

FIG. 2 shows a layout diagram of quasi-optimal binarization of syntactic elements.

DETAILED DESCRIPTION OF EMBODIMENTS

Context Elements and Context Models

The proposed methods of encoding and decoding of data stream, as well as encoder and decoder (see FIG. 7, 8) use context elements. A context element is data forming a portion of full context data. The context elements can be calculated by various, predefined methods. For example, the context elements may be obtained from an element ordinal number during binarization (corresponds to (709, 809)), from values of binarized data (corresponds to (710, 810)) stored in a binarized data buffer (704, 804), or from values of syntactic elements (corresponds to (708, 808)) stored in an input data buffer (703) or a decoded data buffer (803), respectively.

Figures 9, 10:
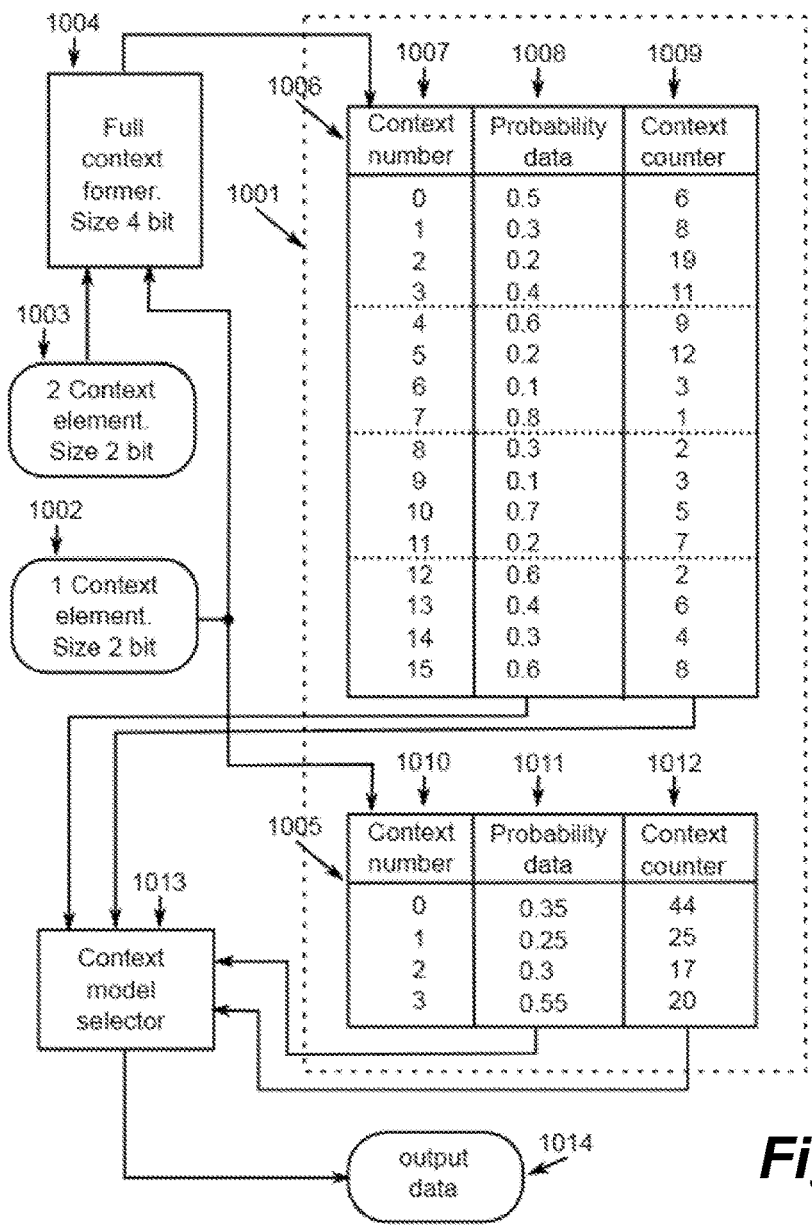
FIG. 9 shows an example of a counter of context occurrence number used in context models according to the invention.
FIG. 10 shows groups of context models, as used in the invention.

In context models, the proposed group of inventions uses counters of a context occurrence number (FIG. 9, 10). Each cell of a context model (901, 1007, 1010) stores, apart from a probability (902, 1008, 1011), a counter of a context occurrence number (903, 1009, 1012) for a given context. During operation of an entropy coder (713) or an entropy decoder (802), which are discussed later in more detail, not only the probability but also the corresponding counters of a context occurrence number for the given context are updated.

The proposed group of inventions uses the groups of context models (FIG. 10). A group of context models (1001) comprises at least two context models (1005, 1006) of different sizes that are intended for work with at least two context elements (1002, 1003). Furthermore, one context model within the group of context models uses a full set of the context elements formed by a full context former (1004). The other context models use smaller sets of the context elements. The context models of a given group of context models comprise different numbers of the cells. For a given context model, the number of the cells is not less than a number of possible states of the context elements associated with said given context model. A context model selector (1013) selects a specified context model from the group of context models, and the data of said specified context model are transferred to an output (1014).

The proposed group of inventions uses a context inheritance procedure. It consists in changing a value of the probability and a value of the counter of a context occurrence number in a cell of an initialized context model by corresponding values from a cell of a parent model. The purpose of this operation is to more fully utilize statistics accumulated in the parent model and, thereby, to improve quality of the context modeling. The inheritance procedure consists in mixing the values of the cells according to a weighting function, for example:

$$Pdo=(Pd \cdot Cd+Pr \cdot (Cr-Cd))/Cr, \quad (A2)$$

$$Cdo=(15 \cdot Cd+Cr+8)/16, \quad (A3)$$

where: Pdo is a mixed probability written into a selected cell of an initialized context model; Cdo is a mixed value of the counter of a context occurrence number, which is written into the selected cell of the initialized context model; Pd is a probability stored in the selected cell of the initialized context model; Cd is the value of the counter of a context occurrence number in the selected cell of the initialized context model; Pr is a probability stored in a selected cell of a parent context model; Cr is a value of the counter of a context occurrence number in the selected cell of the parent context model.

The formulae (A2) and (A3) are used if the conditions Cd>0, Cr≥Cd are met.

Encoding

Figure 3:
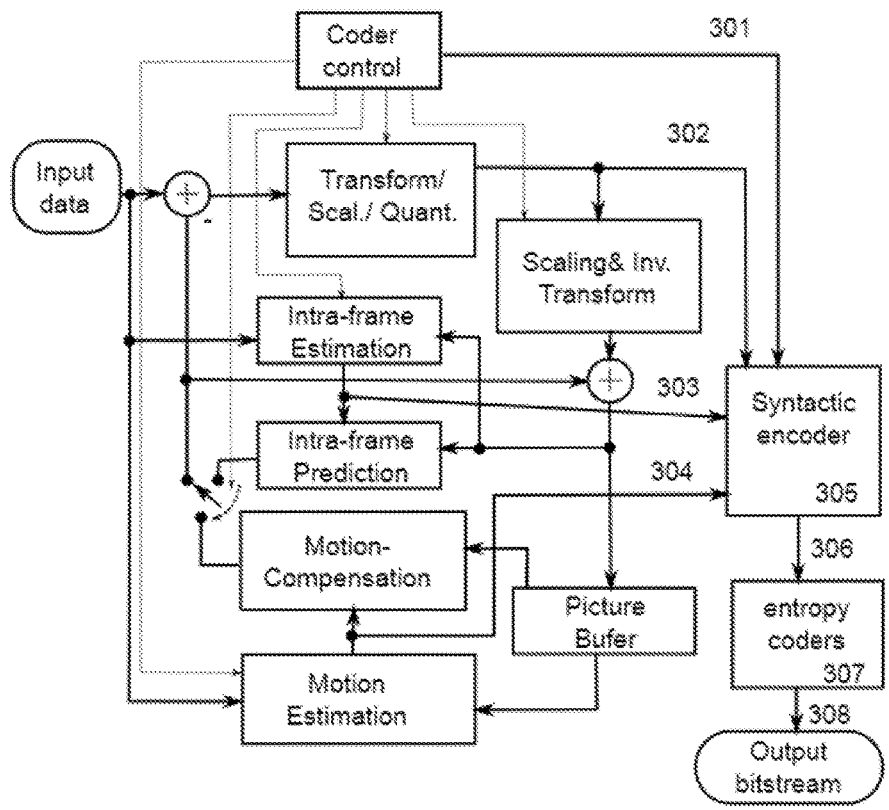
FIG. 3 shows a typical scheme of a video encoder.
Figure 4:
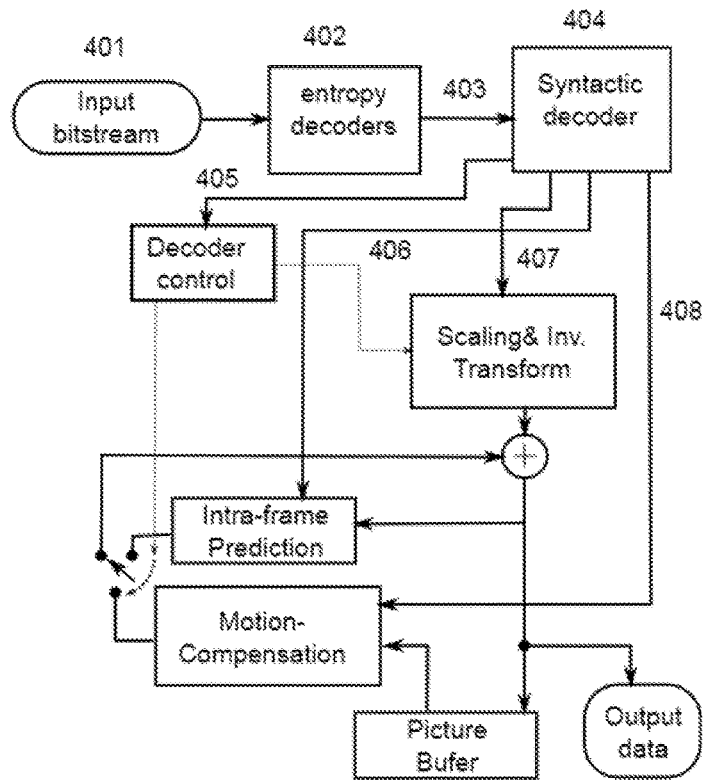
FIG. 4 shows a typical scheme of a video decoder.
Figure 5:
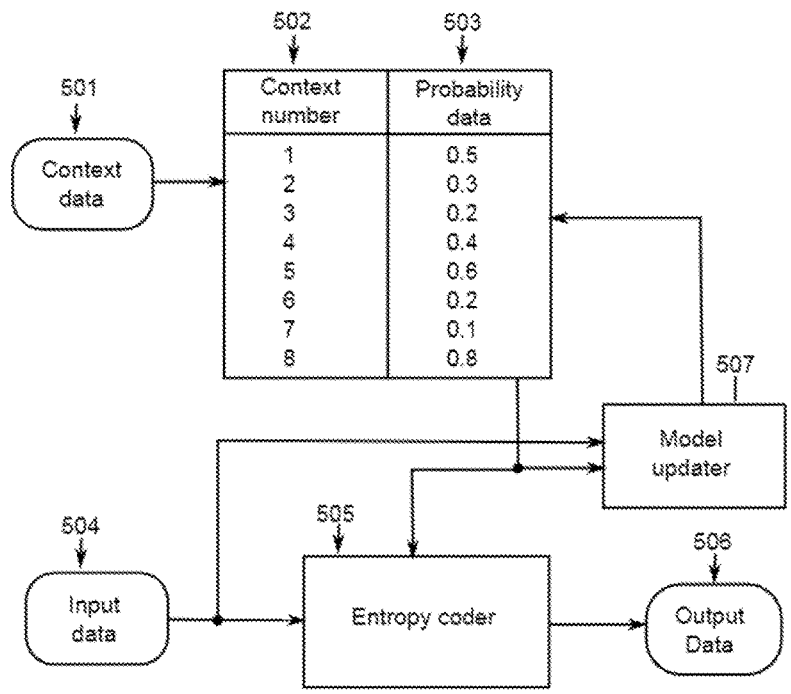
FIG. 5 shows a context model used in the claimed method of encoding.
Figure 6:
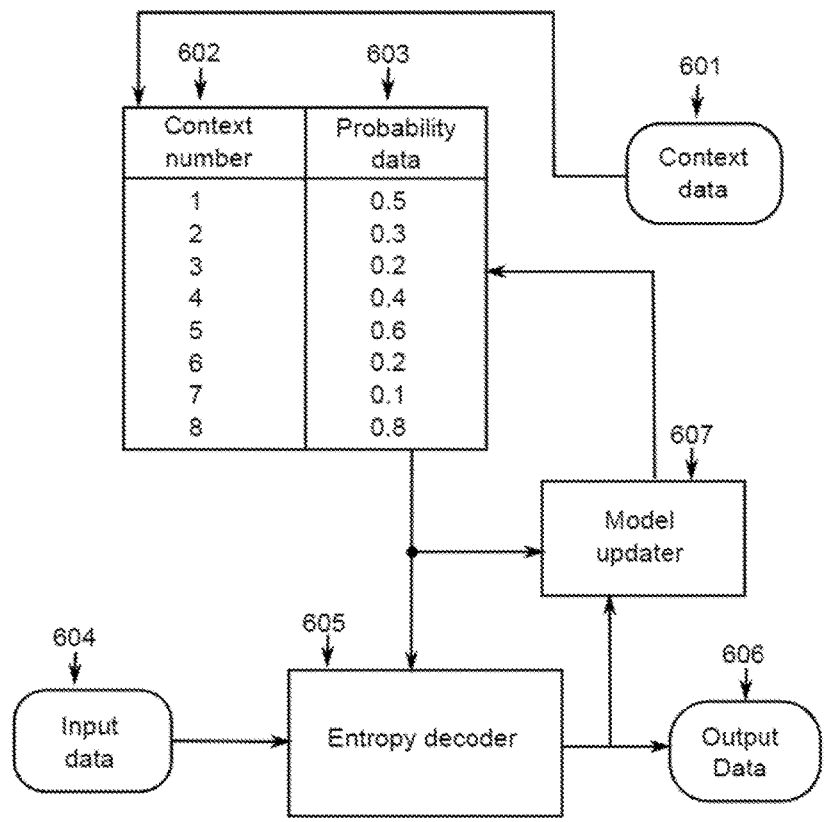
FIG. 6 shows a context model used in the claimed method of decoding.
Figure 7:
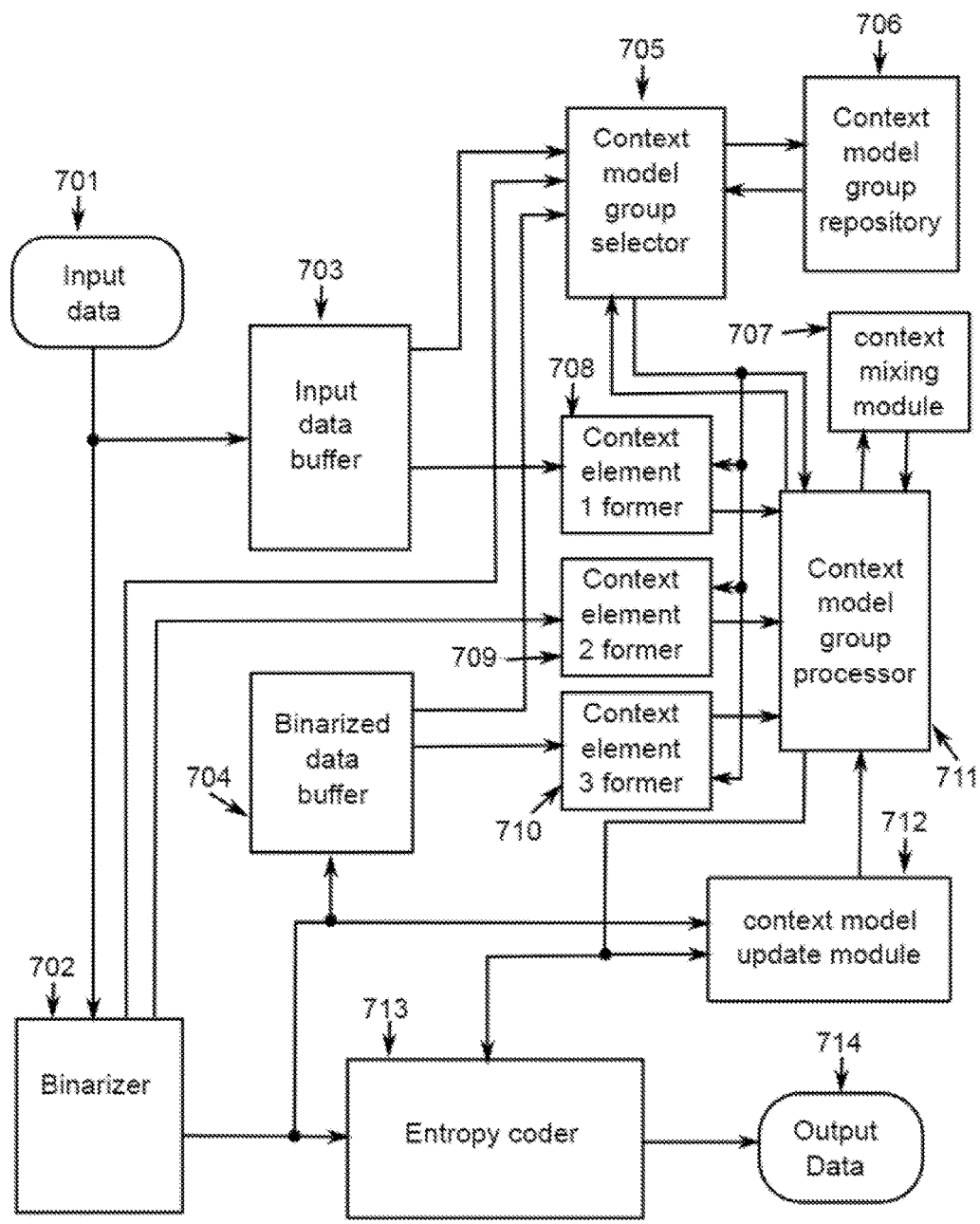
FIG. 7 shows a variant of an encoder according to the invention.

FIG. 7 shows a scheme of an encoder implementing a preferable embodiment of the proposed invention. Input data (701) of syntactic elements enters a binarizer (702) and, simultaneously, is stored in the input data buffer (703). Binarized values of the syntactic elements are stored in the binarized data buffer (704) and, simultaneously, enter an input of the entropy coder (713). A context model group selector (705), using values of the syntactic elements encoded so far, and/or binarization rules, and/or values of the binarized data encoded so far, and/or position and type of the encoded syntactic element in a data stream, selects from a context model group repository (706), a certain group of context models and transfers it to a context model group processor (711). At the same time, context element formers (708, 709, 710) form at least two context elements that are individual for the selected group of context models. The context elements may be formed from the values of the syntactic elements encoded so far (corresponds to (708)), and/or according to the binarization rules (corresponds to (709)), and/or from values of the binarized data encoded so far (corresponds to (710)), and/or from the position and the type of the encoded syntactic element in the data stream. The context model group processor (711), using the values of the counters of a context occurrence number in the corresponding cells of the corresponding context models, selects the current context model and reads a probability. The probability thus obtained is used for encoding of the current binarized bit by the entropy coder (713). The encoded data is transferred to an output data stream (714). After encoding of each bit, a context model update module (712) updates states in the context models in the select group of context models. If the context inheritance criteria are met, a context mixing module (707) mixes and updates the contexts. An updated group of context models is stored in the context model group repository (706). Then, the step of encoding is repeated.

Figure 11:
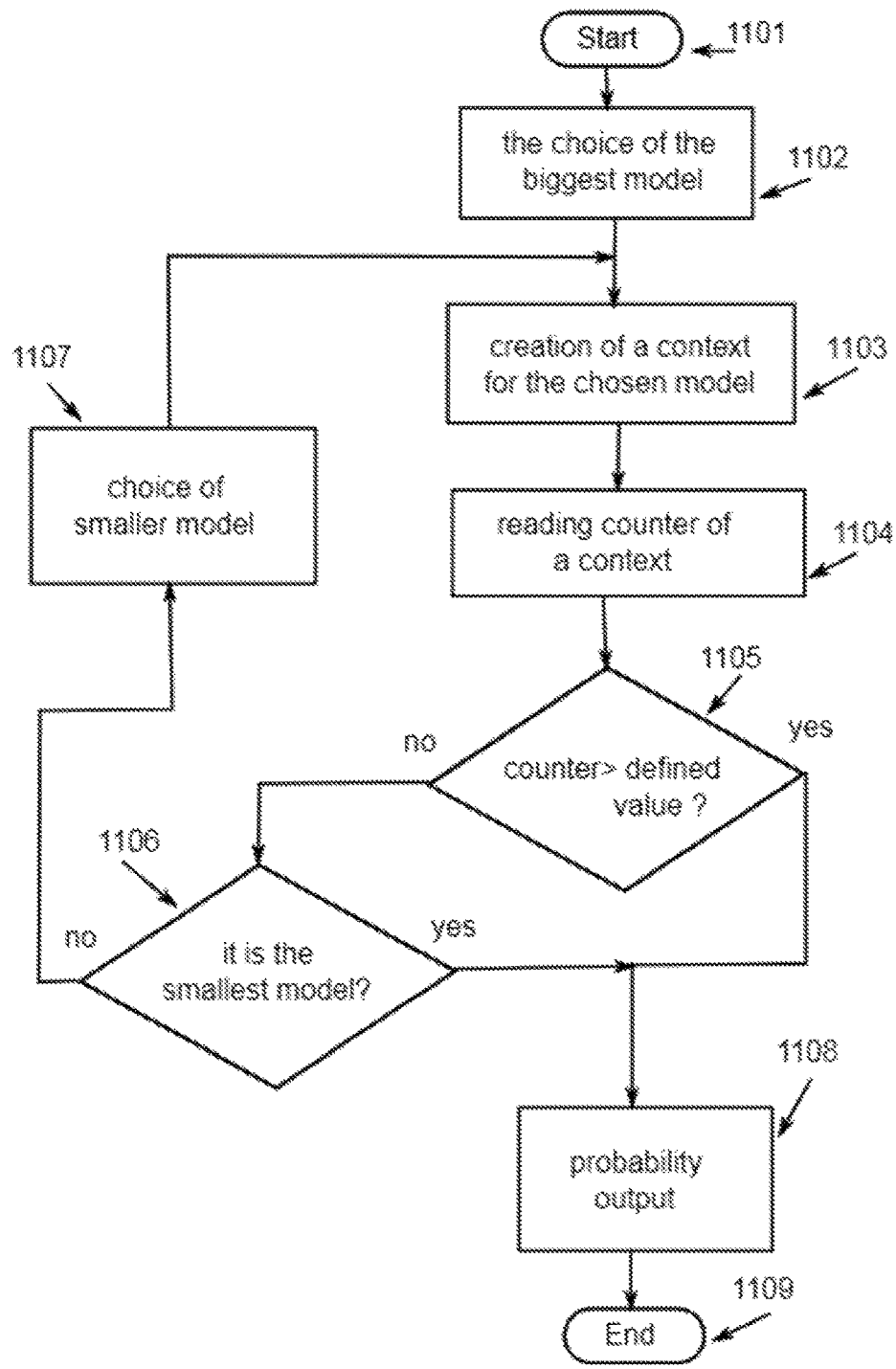
FIG. 11 shows a sequence of operations performed by a context model group processor.

FIG. 11 shows a sequence of operations performed by the context model group processor (711). At a beginning of a process (1101), the biggest context model is selected (1102) from a group of context models. A context is formed (1103) from available context elements associated with the selected context model. A cell is selected from the context model, and a counter of a context occurrence number is read out (1104). If a value of the counter of a context occurrence number is higher than a predefined number (1105), the context model is considered as selected, a probability from a selected cell of the selected context model is transferred to an output (1108), and the process is completed (1109). Otherwise, a check is conducted (1106) whether the selected context model is the smallest one in the group of context models, and if not, a next by size context model is selected (1107), and the process is repeated.

Figure 12:
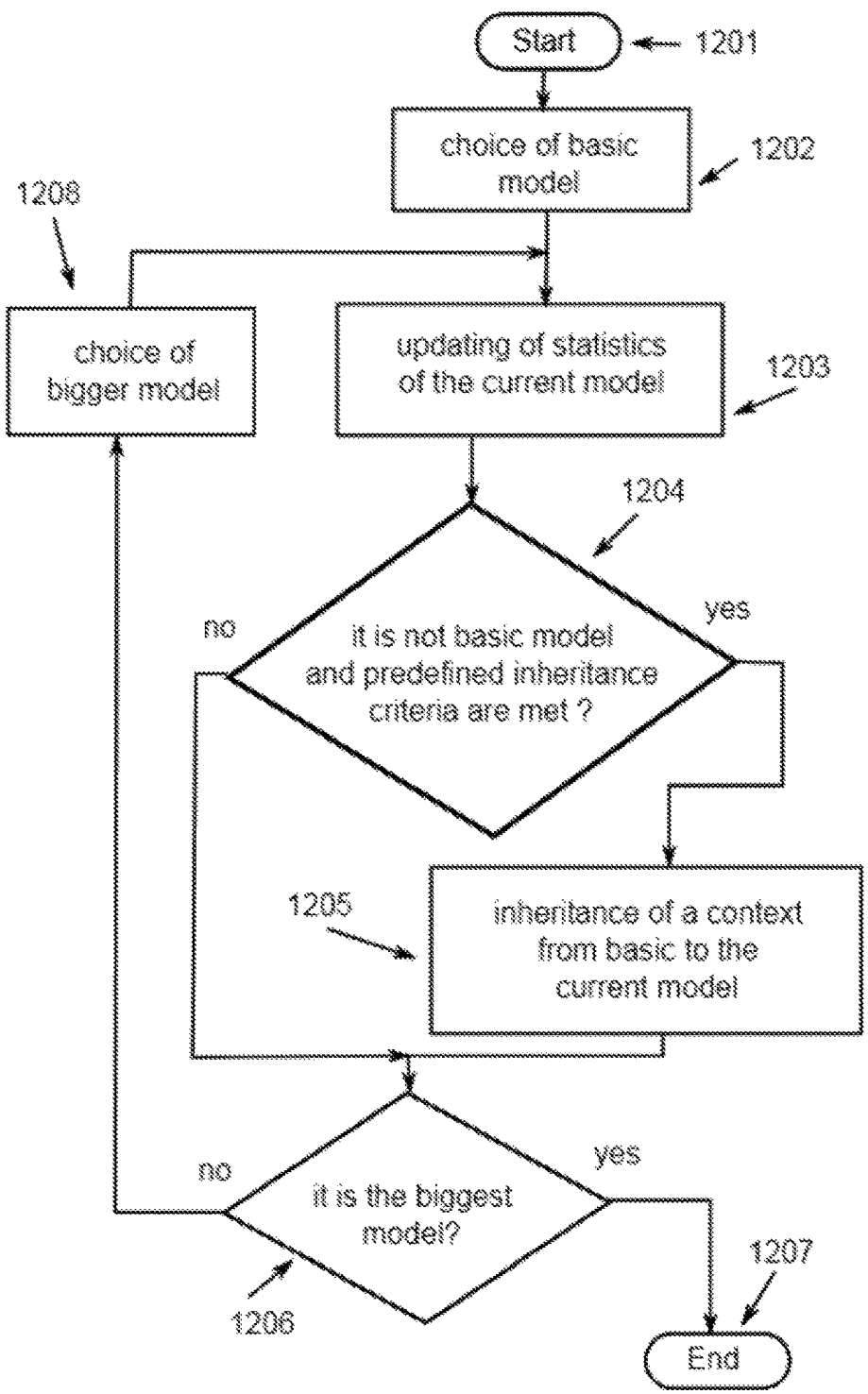
FIG. 12 shows a sequence of operations performed by a model update module and a context mixing module.

FIG. 12 shows a sequence of operations of the context model update module (712) and the context mixing module (707). At a beginning of a process (1201), a basic context model is selected (1202) that has been selected by the context model group processor in the previous encoding step (1108). A state of the basic context model is updated (1203) with the use of the context formed in the previous step (1103). A check is conducted (1206) whether this context model is the biggest in the group of context models. If the current context model is the biggest in the group of context models, an update process is completed (1207). Otherwise, the next, a bigger context model is selected (1208). The state of the basic context model is updated (1203) with the use of the context formed in the previous step (1103). A check is conducted (1204) whether or not predefined inheritance criteria are met for the selected context model. If said predefined inheritance criteria are met, e.g. the counter of a context occurrence number is equal to a predefined value, the context mixing module (707) performs a procedure of context inheritance (1205) from the basic context model to the selected context model. If the selected model is the biggest one in the group of context models (1206), the context model update process is completed (1207). Otherwise, the processing cycle is repeated (1208).

The claimed method of encoding differs from the closest analog according to the technical solutions described in [16], [17] in that no complex evaluation of advantage from switching between context models of different sizes is carried out. Instead, switching is carried out by means of counters of a context occurrence number stored in the context models. Furthermore, contrary to the closest analog, in the present invention a basic model is selected individually, depending on values of the counters of a context occurrence number stored in each cell of each context model, which improves flexibility of the method proposed and increases the total compression efficiency as compared to that provided by the technical solutions according to [16], [17]. Thus, encoding speed is increased in the proposed method, though at the expense of a somewhat greater size of memory required for storing the context models of a greater size.

The proposed encoding method may be implemented in a variety of ways.

If during encoding for any reason, e.g. when the input data buffer (703) for the syntactic element is empty, it is impossible to determine a value of at least one context element for a portion of a data stream, then the value for this context element is set equal to a predefined value.

In order to optimize the process of forming the contexts from the context elements, it is advantageous to set a total number of the cells for the context models in the group of context models as $2^i$, where i is a natural integer.

Figure 13:
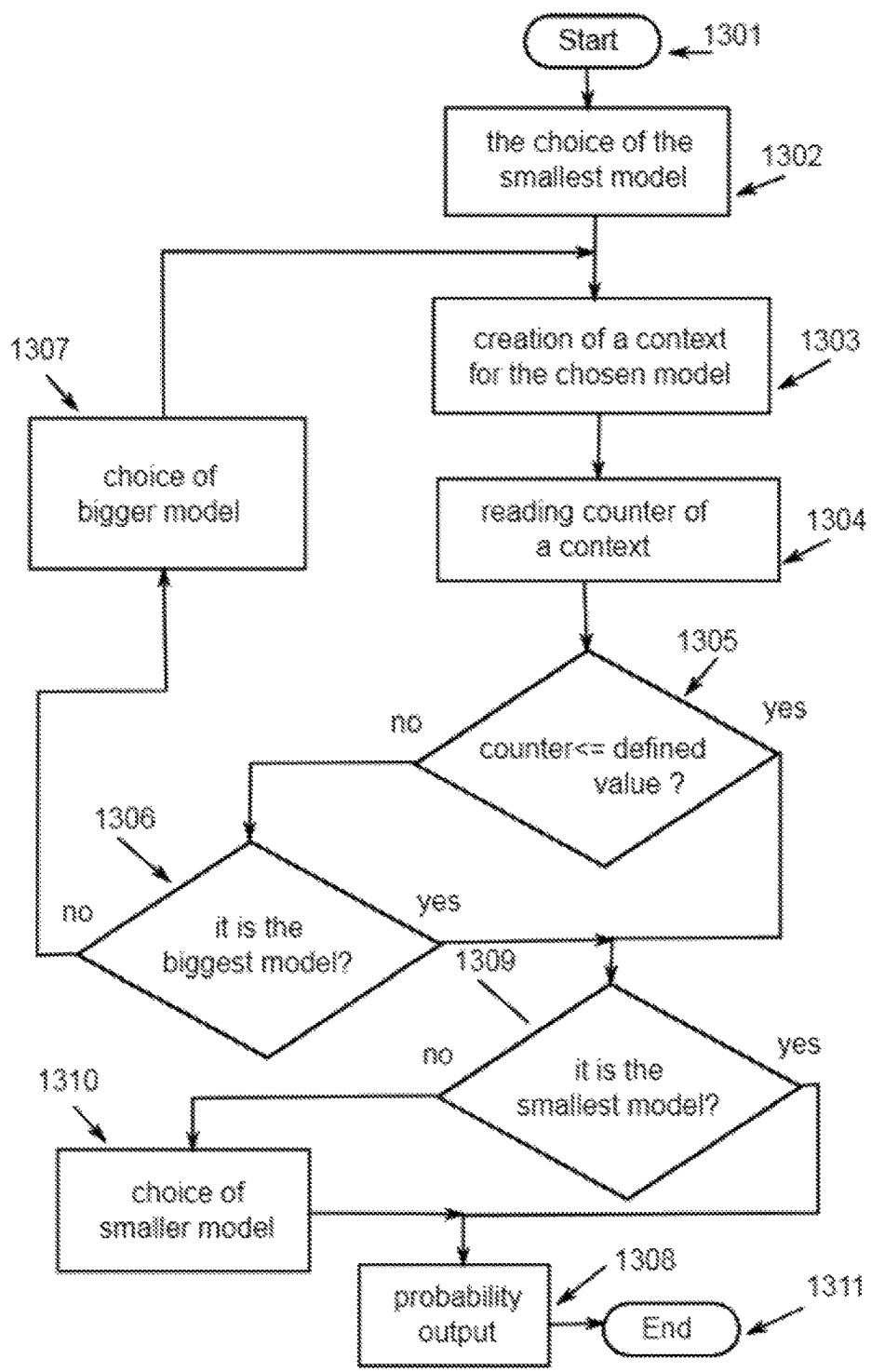
FIG. 13 shows a variant of the flow diagram of a process used for selecting a context model from a group of context models, wherein viewing of the context models in the group of context models starts from the smallest context model.

A variant of the process of selecting the context model from the group of context models consists in viewing models in said group, starting from the smallest one, as shown in FIG. 13. At a beginning of process (1301), the smallest, as to the number of the cells, model in the group of context models is selected (1302). A context is formed (1303) from available context elements for the selected context model. A cell is selected in the context model, and a counter of a context occurrence number is read off (1304). If a value of the counter of a context occurrence number is less than or equal to a predefined value (1305) and the context model is the smallest one in the group of context models (1309), the context model is considered as selected. Otherwise, a next in size, smaller context model is selected (1310). A probability in the selected cell of the selected context model is transferred to an output (1308), and process of selecting the context model is completed (1311) If the value of the counter of a context occurrence number does not comply with a set criterion, a check is carried out (1306) whether the selected context model is the biggest one in the group of context models. If the result of check is false, then a next in size, greater context model is selected (1307), and the process is repeated.

It is possible to implement a variety of methods for updating the value of the probability in the cells of the context model.

Figure 14:
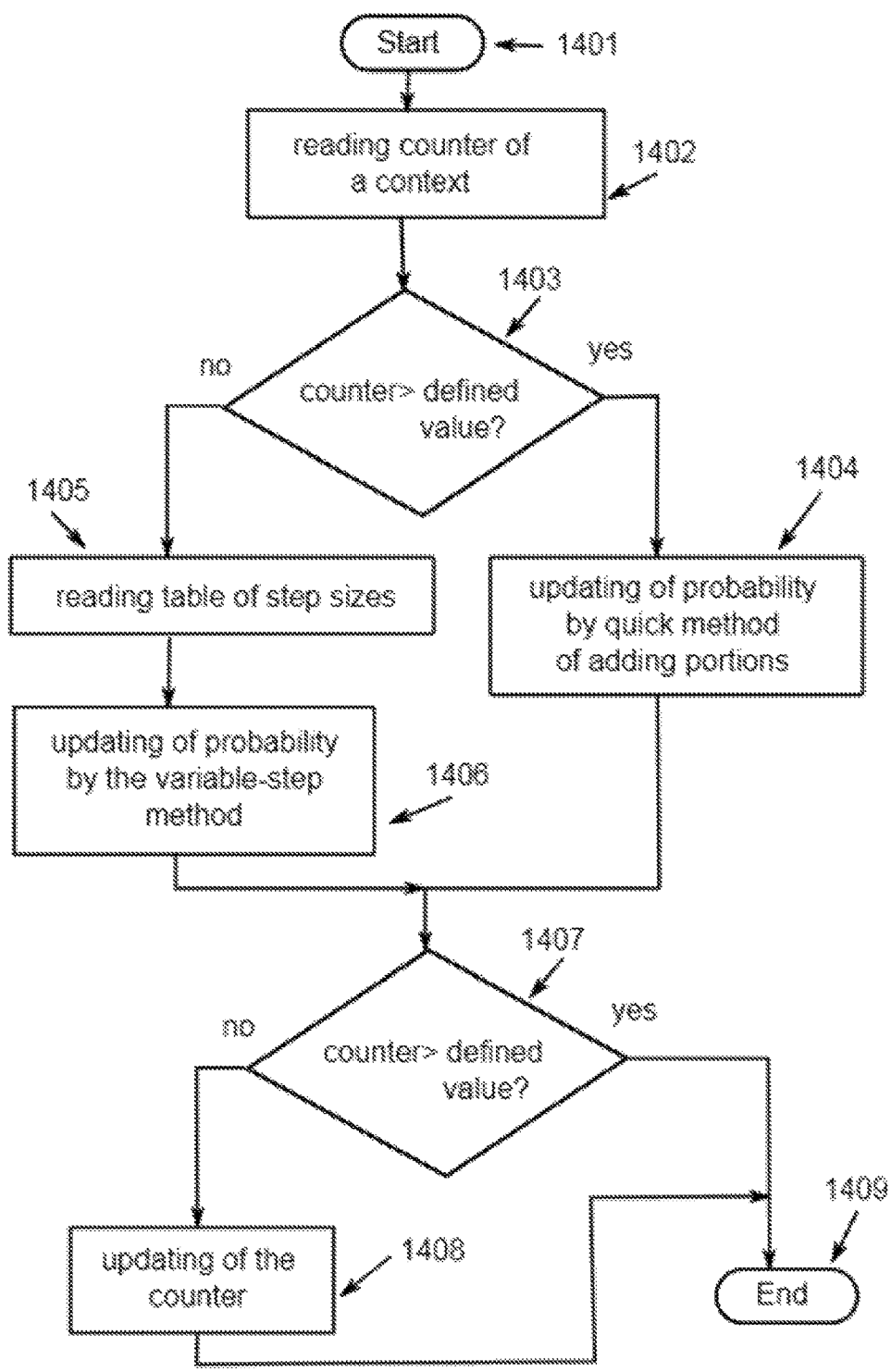
FIG. 14 shows a variant of a scheme used for updating a value of a probability in cells of a context model, wherein several update methods are combined, depending on a value of a counter of a context occurrence number.

One of the variants is a method combining several update methods, depending on the value of the counter of a context occurrence number (FIG. 14). At a beginning of a process (1401), the counter of a context occurrence number in an updated cell is read off (1402). If a value of the counter of a context occurrence number exceeds a predefined value (1403), an update is carried out (1404) by the quick method of adding portions. The purpose of said quick method is to accelerate work of the context model under conditions of the established (stable) context. The quick method is performed according to the following formula:

if bit==1 $Po=Pi+(1-Pi)/N$, if bit==0 $Po=Pi-Pi/N$, (A4)

where: bit is a value of an encoded bit; Po is an updated value of the probability; Pi is an initial value of the probability; N is a coefficient setting an update step. If N has a value multiple of the degree of 2, then this method may be efficiently implemented in modern computational architectures.

If the counter of a context occurrence number does not exceed the predefined value (1403), then updating of the probability is carried out according to the variable-step method. In said method, an individual update step size is set for each value of the counter of a context occurrence number, which size may be read off from a table of step sizes (1405). After the individual step size is read, the update is carried out by the variable-step method (1406). The purpose of this method is to update the probability in rarely occurred contexts quicker, where the value of the probability has not reached an optimal value yet. The variable-step method can be carried out according to the following formula:

if bit==1 $Po=Pi \cdot (1-Step)+Step$, if bit==0 $Po=Pi \cdot (1-Step)$, (A5)

where: bit is an encoded bit value; Po is an updated value of the probability; Pi is an initial value of the probability; Step is a variable step coefficient obtained from the table of step sizes (1405).

After updating the probability, the value of the counter of a context occurrence number is compared to a predefined value (1407). This predefined value may be equal to or greater than that from the step (1403).

If the counter of a context occurrence number is greater than a predefined value, the process is completed (1409). Otherwise, the counter of a context occurrence number is incremented (1408). The purpose of the step (1407) is to not allow overflowing of the counter of a context occurrence number at a limited number of bits used for storing said counter.

Various strategies of the initial initialization of the values of the cell in the groups of context models are possible. The simplest tactics is initialization of all cells with a similar predefined value. Here the point is that, due to a variable adaptation step (A5) after several encoding cycles, the values that are close to optimal ones will be achieved in the context models.

Another method of the initial initialization of the values of the cell in the groups of context models is preliminary collection of statistics on typical data and initialization of at least one context model with this typical data.

The most complex method is the method of initial initialization of the values of the cell in the groups of context models, wherein values of the probability, as collected in the process of encoding, are transferred to the output data stream and used in the process of decoding. Since the probability is of great size for great sizes of the context models, a variant of this method is possible, wherein preliminarily collected probabilities are transferred only for the smallest context models of the group of context models.

In the process of encoding by the proposed method a variety of context element calculation variants are possible. Among the most important methods of calculating of the context elements are those using data stream syntactic elements encoded so far. They include, but not limited to, the following methods: calculation of the value of the context element from values of the syntactic elements encoded so far; calculation of the value of the context element from values of individual bits of the syntactic elements encoded so far; calculation of the value of the context element on the basis of a position of the encoded syntactic element in the data stream. Moreover, the encoded syntactic elements may make up one-dimensional, and/or two-dimensional, and/or three-dimensional arrays, and the context elements may be calculated on the basis of a position of each encoded syntactic element in such the arrays.

Various variants of the method of selecting the groups of context models are possible in the process of encoding according to the proposed method.

Among the most important methods of selecting the groups of context elements are those using data stream syntactic elements encoded so far. They include, but not limited to, the following methods: selection of the group of context models by the type of an encoded syntactic element; selection of the group of context models by values of the syntactic elements encoded so far; selection of the group of context models by values of individual bits of the syntactic elements encoded so far; selection of the group of context models by the position of the encoded syntactic element in the data stream. Moreover, the encoded syntactic elements may make up one-dimensional, and/or two-dimensional, and/or three-dimensional arrays, and the context elements may be calculated on the basis of a position of each encoded syntactic element in such the arrays.

Important variants of the proposed method of encoding are those wherein preliminary binarization of the syntactic elements in the data stream is performed. Efficiency of work of the context modeling directly depends on quality and specificity of the binarization process. If the process of binarization of the syntactic element is carried out according to one binarization method, it includes, but is not limited to, the following methods for calculating the context elements: calculation of the value of the context element from the number of an encoded bit in a bit string obtained in the process of binarization; calculation of the context element from values of the bits, as encoded so far, in a binarized string.

Also, various groups of context models may be selected in the process of binarization. The following methods are possible, but are not limited to: selection of the group of context models on the basis of the number of the encoded bit in the bit string obtained in the process of binarization; selection of the group of context models, depending on the values of the bits, as encoded so far, in the binarized string.

In order to optimize the process of binarization, it is possible to use predefined tree structures obtained by the Huffman method from statistics collected on a typical set of the encoded data. FIG. 2 shows an example of such the structure.

Figure 15:
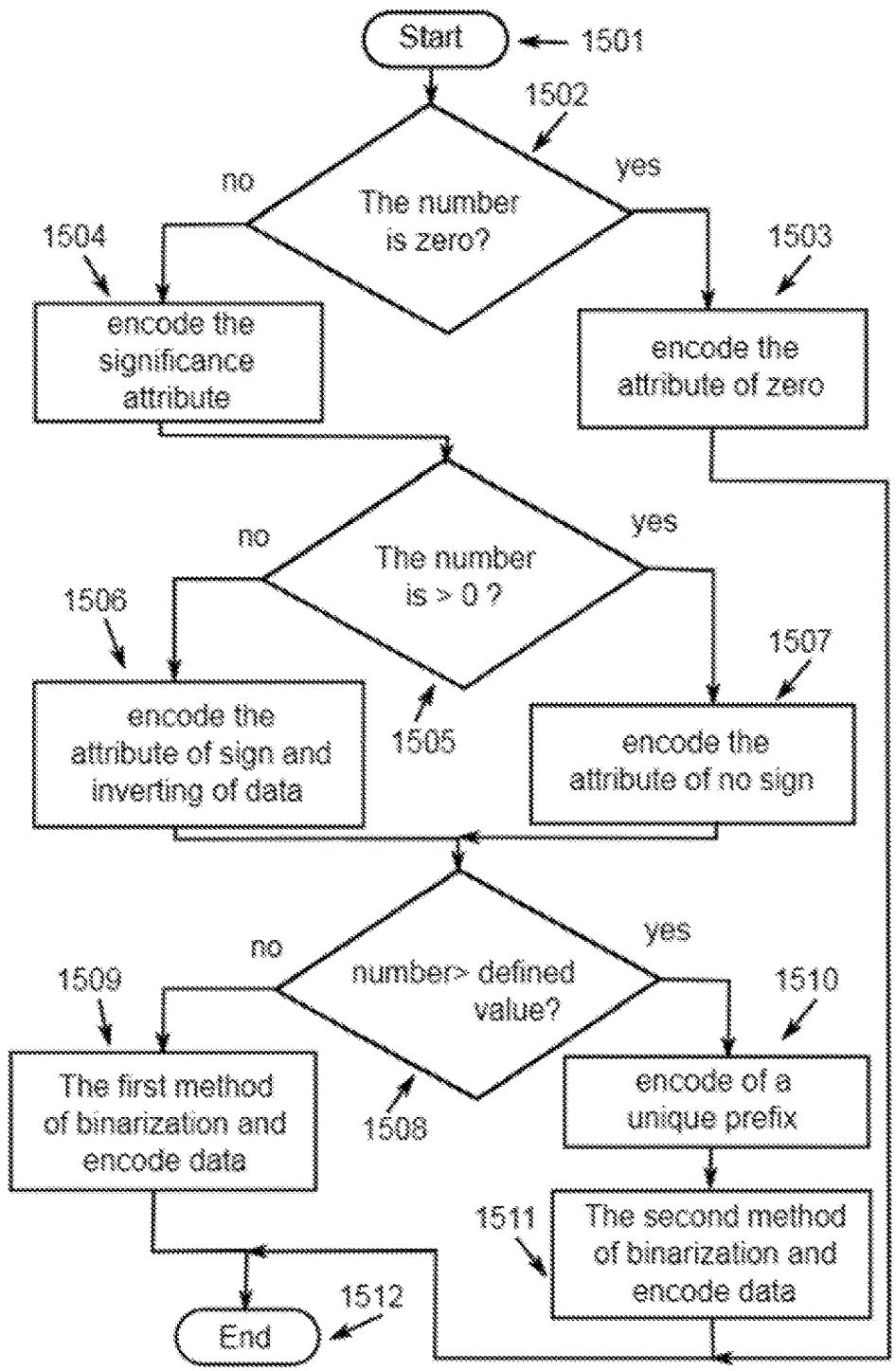
FIG. 15 shows a layout diagram of encoding and binarization of a syntactic element in the form of an integer with a sign.

In order to further optimize the context modeling, it is possible to use several methods of binarization in the process of binarization of one syntactic element. Furthermore, various context elements and various groups of context models are selected, depending on the method of binarization used and results of the previous binarization steps. As an example, let's consider a complex multistage process of encoding and binarization of the syntactic element in the form of an integer with a sign (FIG. 15). At a beginning of the process (1501), a check is conducted (1502) whether the encoded value is equal to zero. If yes, the zero attribute is encoded (1503), and then encoding is completed (1512). Otherwise, the significance attribute is encoded (1504). The zero attribute and the significance attribute are encoded by an individual group of context models, which context elements are obtained from the values of the zero attribute and the significance attribute, as encoded so far, as well as from a position of the encoded syntactic element in the data stream.

Then, the sign of the value to be encoded is checked (1505). If this value is less than zero, the sign attribute is encoded and the value is inverted (1506) in order to transfer an absolute value of the value to the next stage. Otherwise, the attribute of no sign is encoded (1507). The sign attributes are encoded by an individual group of context models which context elements are obtained from the sign attributes, as encoded so far, as well as from a position of the encoded syntactic element in the data stream.

Then, a check is conducted (1508) whether the absolute value of the encoded value is greater than the predefined value. If the encoded value is smaller than the predefined value, then the value is binarized and encoded by a first predefined method (1509), for example, using the tree structure obtained by the Huffman method from statistics collected on the typical set of the encoded data (FIG. 2). Furthermore, encoding is carried out by an individual group of context models which context elements are obtained from the values of the syntactic elements encoded so far, the position of the encoded syntactic element and the sign attribute of the encoded number. If the encoded value is greater than the predefined value, then a unique predefined prefix is encoded (1510), which enables to distinguish the value binarized by a second binarization method (1511).

Then, the value is binarized and encoded by the second binarization method (1511), for example, by the Elias gamma code [1] (106). The value which is binarized by the second method is encoded by the individual group of context models which context elements are obtained from the values of the syntactic elements encoded so far, the position of the encoded syntactic element and the sign attribute of the encoded value.

Figure 16:
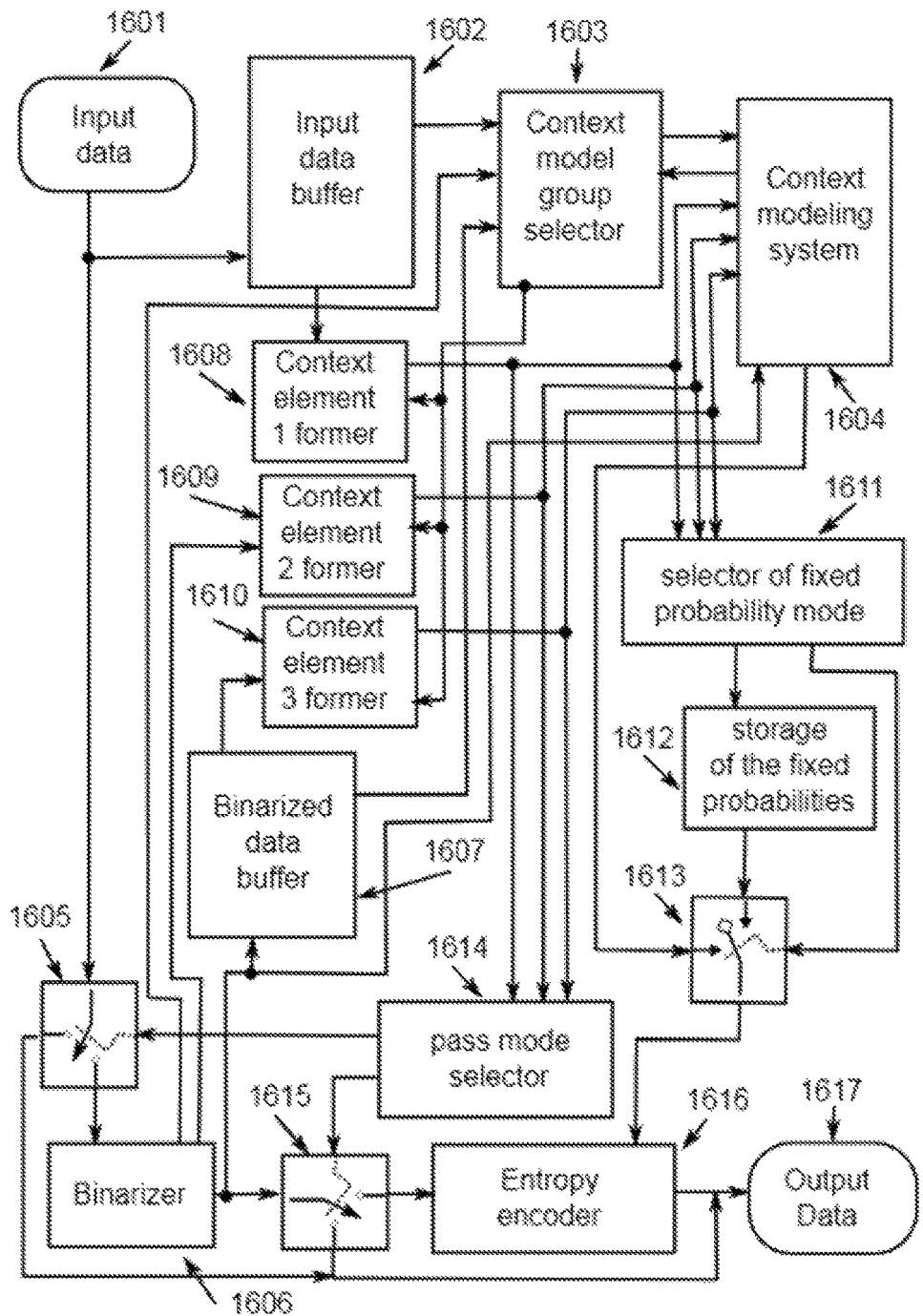
FIG. 16 shows a variant of an encoding diagram, wherein a portion of syntactic elements or a portion of bits of binarized syntactic elements is written into a data stream without the step of entropy encoding and/or encoded by using predefined values of probability.

Important variants of the proposed invention are those wherein a portion of the syntactic elements or a portion of the bits of the binarized syntactic elements, depending on the value of at least one context element associated therewith, are written into the data stream without performing the step of entropy encoding (FIG. 16). In practice, the aim of this approach is acceleration of operation of the entropy coder for those bits in the initial data string that may not be efficiently compressed by entropy encoding.

An input sequence of syntactic elements (1601) is passed to a binarizer (1606) through a syntactic element pass switch (1605) and, simultaneously, is stored in an input data buffer (1602). Binarized values of the syntactic elements are stored in a binarized data buffer (1607). A context model group selector (1603), on the basis of the values of the syntactic elements encoded so far, and/or the binarization rules, and/or the values of the binarized data encoded so far, and/or position and type of the encoded syntactic element in the data stream, selects the group of context models and transfers it to a context modeling system (1604) that uses the groups of context models. At the same time, context element formers (1608, 1609, 1610) form at least two context elements that are individual for the selected group of context models. The context elements may be formed from the values of the syntactic elements encoded so far (corresponds to (1608)), and/or the binarization rules (corresponds to (1609)), and/or the values of the binarized data encoded so far (corresponds to (1610)), and/or from the position and type of the encoded syntactic element in the data stream. A pass mode selector (1614) forms, on the basis of the values of the context elements (correspond to 1608, 1609, 1610), a pass signal that is transferred to the syntactic element pass switch (1605) and/or to a pass switch for bits of the binarized string (1615). The syntactic element pass switch (1605) transfers the selected syntactic element to an output data stream (1617), bypassing the subsequent processing step. The pass switch for bits of the binarized string (1615) transfers the bits selected from the output string to the output data stream (1617), bypassing the step of an entropy coder (1616). If no one of the bypass routes is selected, the obtained bits are transferred to the entropy coder (1616) where current bits are encoded with the use of a probability predicted by the context model in the context modeling system (1604). The encoded data is transferred to the output data stream (1617).

The proposed invention may have embodiments wherein a portion of syntactic elements or a portion of bits of binarized syntactic elements, depending on the value of at least one context element associated therewith, are encoded with the use of predefined values of the probability (FIG. 16).

The input sequence of the syntactic elements (1601) is passed to the binarizer (1606) through the syntactic element pass switch (1605) and, at the same time, is stored in the input data buffer (1602). The binarized values of the syntactic elements are stored in the binarized data buffer (1607) and, at the same time, are passed to the input of the entropy coder (1616). The context model group selector (1603) selects, on the basis of the values of the syntactic elements encoded so far, and/or the binarization rules, and/or the values of the binarized data encoded so far, and/or the position and type of the encoded syntactic element in the data stream, the group of context models and transfers it to the context modeling system (1604) that uses the groups of context models. At the same time, the context element formers (1608, 1609, 1610) form at least two context elements individual for the selected groups of context models. The context elements may be formed from the values of the syntactic elements encoded so far (corresponds to (1608)), and/or the binarization rules (corresponds to (1609)), and/or the values of the binarized data encoded so far (corresponds to (1610)), and/or from the position and type of the encoded syntactic element in the data stream. A selector of fixed probability mode (1611) performing selection of the mode of encoding with the fixed probability forms, on the basis of the values of the context elements (correspond to 1608, 1609, 1610), a signal of encoding with the fixed probability that is transferred to a fixed probability selection switch (1613) and, simultaneously, to a storage of the fixed probabilities (1612) where the fixed probability is selected which is associated with the encoded element. The probability thus obtained is used for encoding of the current binarized bit in the entropy coder (1616). The encoded data is transferred to the output data stream (1617).

An important variant of the proposed method for passing bits is a method wherein the syntactic element pass switch (1605) and/or the pass switch for bits of the binarized string (1615) operate depending on the obtained probability for a given bit. The context model group processor (711) uses values of the counters of a context occurrence number in the corresponding cells of the corresponding context models for selecting the current context model and reading off the probability. If the probability thus obtained is in the range that is predefined with pre-established values and/or the counter of a context occurrence number has a value greater or smaller than the predefined value, then entropy encoding is not carried out, and the bit value transfers, through the binarized string bit switch (1615), selected bits from the input string to the input of the binarizer (1606), bypassing the entropy coder (1616), or, if the binary syntactic element is encoded, the value of that syntactic element is transferred, through the syntactic element pass switch (1605), to the output data stream (1617), bypassing the subsequent step of encoding.

As earlier described in the preferred embodiments of the method of encoding of syntactic elements of a data stream, the corresponding encoder for encoding the syntactic elements of the data stream comprises the entropy coder (713, 1616), the input data buffer (703, 1602), the binarized data buffer (704, 1607), the context model group selector (705, 1603), the context model group repository (706), the context model group processor (711), the context element formers (708, 709, 710, 1608, 1609, 1610), the model update module (712), and the context mixing module (707).

The encoder may further comprise the binarizer (702, 1606) for binarization of the nonbinary syntactic elements. In particular embodiments, which are discussed earlier in detail, the encoder may further comprise at least one of: the selector of fixed probability mode (1611), the syntactic element pass switch (1605), the binarized string bit switch (1615), the pass mode selector (1614).

It will be appreciated by those skilled in the art that the encoder may be implemented at the hardware level, i.e. with the use of electronic components; or at the hardware-software level, for example, on the basis of programmable integral circuits. The encoder may be also implemented fully at the software level, i.e. may be represented by a program code executed in such a device as a computer, a mobile electronic device, an embedded electronic device or another similar device comprising a processor for executing commands, transitory and/or non-transitory memory etc., which are all well known for those skilled in the art.

Also, those skilled in the art will also appreciate that the encoder, as described earlier, and a decoder, as will be described further, in any variants of their implementation may be individual objects independent of each other. Alternatively, the encoder and the decoder may be implemented as a single object. This single object may be a encoder-decoder implemented at the software-hardware level, for example, with the use of programmable logic devices (PLD). Another implementation example of said encoder-decoder may be an application program for a mobile electronic device or a computer. Also, said encoder-decoder may be a hardware encoder-decoder having common or separate electronic units and/or used as a board for expanding functionality of an electronic device. Other variants of joint or individual implementation of the encoder and the decoder are also possible.

Decoding

Figure 8:
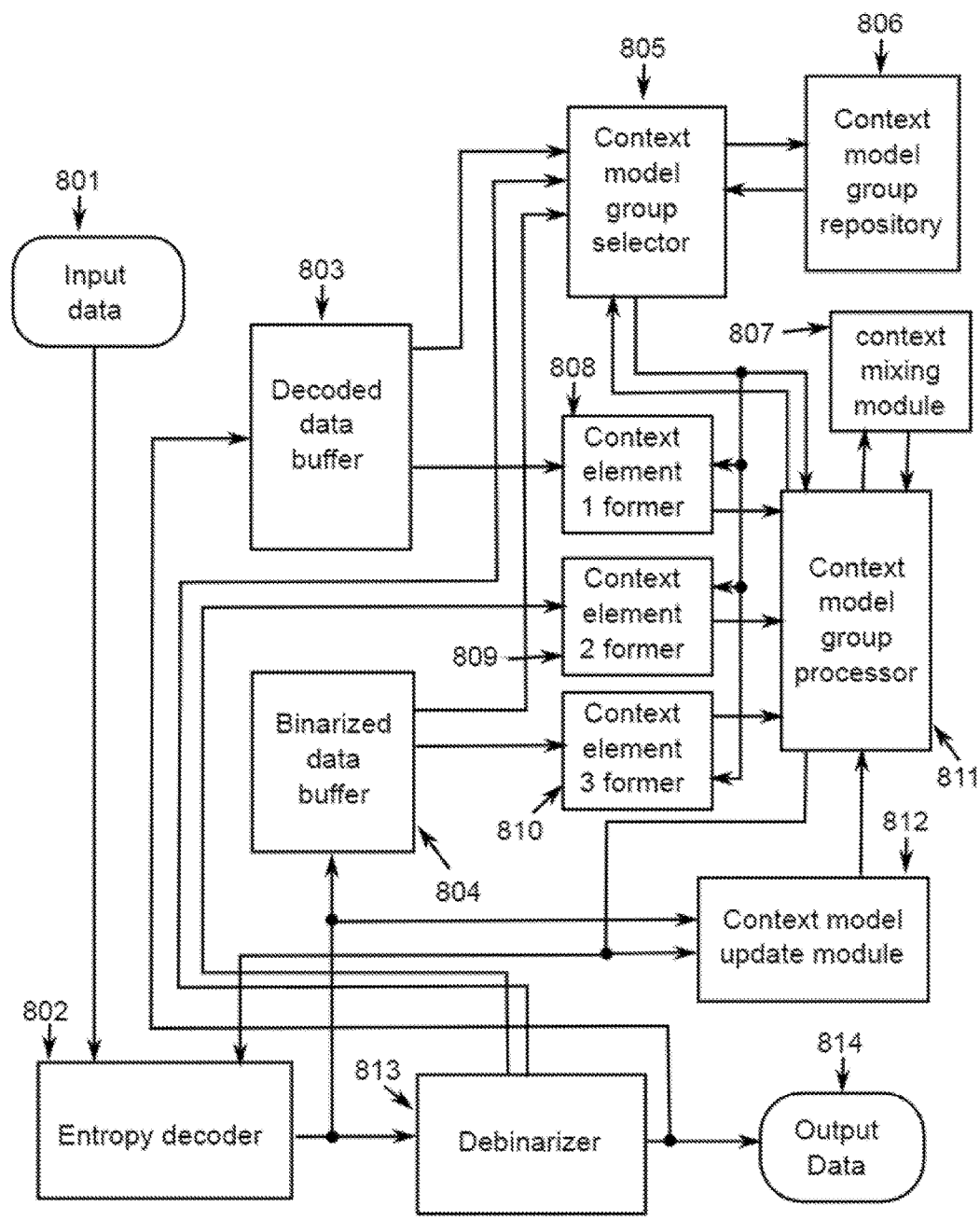
FIG. 8 shows a variant of a decoder according to the invention.

FIG. 8 shows a scheme of an embodiment of a decoder according to the present invention. Input (encoded) data (801) is decoded by the entropy decoder (802). Then, a decoded binarized string is stored in the binarized data buffer (804) and, at the same time, transferred to an input of a debinarizer (813). Debinarized syntactic elements are stored in the decoded data buffer (803) and, at the same time, transferred to an output data stream (814) of decoded syntactic elements. A context model group selector (805) selects, on the basis of values of earlier decoded syntactic elements, and/or the binarization rules, and/or values of binarized data decoded so far, and/or a position and type of the decoded syntactic element in a data stream, a certain group of context models from a context model group repository (806) and transfers it to a context model group processor (811). Simultaneously, context element formers (808, 809, 810) form at least two context elements individual for the selected groups of context models. The context elements may be formed from values of the earlier decoded syntactic elements (corresponds to (808)), and/or the binarization rules (corresponds to (809)), and/or the values of the binarized data decoded so far (corresponds to (810)), and/or from the position and type of the decoded syntactic element in the data stream. The context model group processor (811) uses the values of the counters of a context occurrence number in corresponding cells of the corresponding context models for selecting the current context model and reading off a probability. The probability thus obtained is used for decoding a current binarized bit in the entropy decoder (802). After decoding of each bit, a context model update module (812) updates a state in the group of context models. If the context inheritance criteria are met, a context mixing module (807) performs mixing and update of the context. The updated group of context models is stored in the context model group repository (806). Then, the decoding cycle is repeated.

FIG. 11 shows a sequence of operations performed by the context model group processor (811). At a beginning of a process (1101), the biggest context model is selected (1102) from a group of context models. A context is formed (1103) from available context elements associated with the selected context model. A cell is selected from the context model, and a counter of a context occurrence number is read out (1104). If a value of the counter of a context occurrence number is higher than a predefined number (1105), the context model is considered as selected, a probability from a selected cell of the selected context model is transferred to an output (1108), and the process is completed (1109). Otherwise, a check is conducted (1106) whether the selected context model is the smallest one in the group of context models, and if not, a next by size context model is selected (1107), and the process is repeated.

FIG. 12 shows a sequence of operations of the model update module (812) and the context mixing module (807). At a beginning of a process (1201), a basic context model is selected (1202) that has been selected by the context model group processor in the previous encoding step (1108). A state of the basic context model is updated (1203) with the use of the context formed in the previous step (1103). A check is conducted (1206) whether this context model is the biggest in the group of context models. If the current context model is the biggest in the group of context models, an update process is completed (1207). Otherwise, the next, a bigger context model is selected (1208). The state of the basic context model is updated (1203) with the use of the context formed in the previous step (1103). A check is conducted (1204) whether or not predefined inheritance criteria are met for the selected context model. If said predefined inheritance criteria are met, e.g. the counter of a context occurrence number is equal to a predefined value, the context mixing module (807) performs a procedure of context inheritance (1205) from the basic model into the selected model. If the selected model is the biggest one in the group of context models (1206), the context model update process is completed (1207). Otherwise, the processing cycle is repeated (1208).

The proposed method of decoding differs from the closest analog according to the technical solutions described in [16], [17] in that a complex evaluation of advantage from switching between the context models is not carried out. Instead, switching is carried out by means of the counters of a context occurrence number stored in the context models. Furthermore, contrary to the closest analog, the basic model according to the present invention is individually selected, depending on the values of the counters of a context occurrence number stored in each cell of each context model, which improves flexibility of the proposed method and increases the total compression efficiency as compared to the technical solutions according to [16], [17]. Thus, decoding speed is increased in the proposed method, though at the expense of a somewhat larger size of memory required for storing the context models of greater size.

There is a wide variety of variants of the proposed method of decoding.

If, when decoding of a portion of the data stream for any reason, e.g., the decoded data buffer (803) for the syntactic elements is empty, it is impossible to determine a value of at least one context element for a portion of the data stream, then a predefined value is used for the value of this context element.

In order to optimize the process of forming the contexts from the context elements, it is advantageous to set a total number of cells in the context models in the group of context models as $2^i$, where i is a natural integer.

A variant of the process of selecting the context model from the group of context models is viewing of the context models in said group starting from the smallest context model (see FIG. 13). At the beginning of the process (1301), the smallest, as to the number of cells, context model is selected (1302) in the group of context models. A context is formed (1303) from available context elements for the selected context model. A cell is selected in the context model, and a counter of a context occurrence number is read off (1304). If a value of the counter of a context occurrence number is less than or equal to a predefined value (1305) and the context model is the smallest one in the group of context models (1309), the context model is considered as selected. Otherwise, a next in size, smaller context model is selected (1310). A probability in the selected cell of the selected context model is transferred to an output (1308), and process of selecting the context model is completed (1311). If the value of the counter of a context occurrence number does not comply with a set criterion, a check is carried out (1306) whether the selected context model is the biggest one in the group of context models. If the result of check is false, then a next in size, greater context model is selected (1307), and the process is repeated.

It is possible to implement a variety of methods used for updating the value of the probability in the cells of the context model.

One of the variants is a method combining several methods of update, depending on the value of the counter of a context occurrence number (FIG. 14). At the beginning of the process (1401), the counter of a context occurrence number in the updated cell is read out (1402). If a value of the counter of a context occurrence number exceeds a predefined value (1403), an update is carried out (1404) by the quick method of adding portions. The purpose of said quick method is to accelerate work of the context model under conditions of the established (stable) context. The quick method is performed according to the following formula:

$$\text{if bit}==1 \ Po=Pi+(1-Pi)/N,$$

$$\text{if bit}==0 \ Po=Pi-Pi/N, \qquad (A6)$$

where: bit is a value of an encoded bit; Po is an updated value of the probability; Pi is an initial value of the probability; N is a coefficient setting an update step. If N has a value multiple of the degree of 2, then this method may be efficiently implemented in modern computational architectures.

If the counter of a context occurrence number does not exceed the predefined value (1403), then updating of the probability is carried out according to the variable-step method. In said method, an individual update step size is set for each value of the counter of a context occurrence number, which size may be read off from a table of step sizes (1405). After the individual step size is read, the update is carried out by the variable-step method (1406). The purpose of this method is to update the probability in rarely occurred contexts quicker, where the value of the probability has not reached an optimal value yet. The variable-step method can be carried out according to the following formula:

$$\text{if bit}==1 \ Po=Pi\cdot(1-\text{Step})+\text{Step},$$

$$\text{if bit}==0 \ Po=Pi\cdot(1-\text{Step}), \qquad (A7)$$

where: bit is an encoded bit value; Po is an updated value of the probability; Pi is an initial value of the probability; Step is a variable step coefficient obtained from the table of step sizes (1405).

After updating the probability, the value of the counter of a context occurrence number is compared to a predefined value (1407). This predefined value may be equal to or greater than that from the step (1403).

If the counter of a context occurrence number is greater than a predefined value, the process is completed (1409). Otherwise, the counter of a context occurrence number is incremented (1408). The purpose of the step (1407) is to not allow overflowing of the counter of a context occurrence number at a limited number of bits used for storing said counter.

Various strategies are possible for initial initialization of values of the cells in the groups of context models. The simplest tactics is to initialize all cells with a similar predefined value. Here the point is that due to the variable adaptation step (A7), the values close to optimal ones will be achieved in the context models after several decoding cycles.

Another method of initial initialization of values of the cells in the groups of context models consists in preliminary collection of statistics on typical data and initialization of at least one context model with such typical data.

The most complex method is a method of initial initialization of values of the cells in the groups of context models, wherein the initial values of the probability are read from the decoded stream prior to implementation of the main method of decoding. Since the probability data is large for the context models of large size, a variant of this method is possible, wherein the preliminary collected probabilities are read from the input stream only for the smallest context models in the group of context models.

Various variants of calculation of the context elements are possible in the process of decoding according to the proposed method. Among the most important methods for calculation of the context elements are those using already decoded syntactic elements of the data stream. The following methods are possible, including, but not limited to: calculation of a value of the context element from values of the earlier decoded syntactic elements; calculation of the value of the context element from the values of individual bits of the earlier decoded syntactic elements; calculation of the value of the context element on the basis of a position of the decoded syntactic element in the data stream. Moreover, the decoded syntactic elements may make up one-dimensional, and/or two-dimensional, and/or three-dimensional arrays, and the context elements may be calculated depending on positions of the decoded syntactic elements in said arrays.

Various variants of the method for selecting the groups of context models are possible in the process of decoding according to the proposed method.

Among the most important methods for selecting the groups of context elements are those using already decoded syntactic elements of the data stream. The following methods are possible including, but not limited to: selection of the group of context models on the basis of the type of the decoded syntactic element; selection of the group of context models by values of the earlier decoded syntactic elements; selection of the group of context models by the values of individual bits of the earlier decoded syntactic elements; selection of the group of context models on the basis of the position of the decoded syntactic element in the data stream. Moreover, the decoded syntactic elements may make up one-dimensional, and/or two-dimensional, and/or three-dimensional arrays, and the groups of context models may be selected depending on positions of the decoded syntactic elements in said arrays.

Among important variants of the proposed method of decoding are those wherein the binarized syntactic elements of the data stream are decoded. Quality and specific features of the debinarization process directly affect efficiency of the context modeling work. If debinarization of the syntactic element is carried out by one method of debinarization, the following methods for calculating the context elements are possible including, but not limited to: calculation of the value of the context element from the number of the decoded bit in the decoded binarized bit string; calculation of the context element from the values of the bits decoded so far in the binarized string.

Also, it is possible to select various groups of context models in the process of decoding of the binarized data. The following methods are possible including, but not limited to: selection of the group of context models depending on the number of the decoded bit in the decoded binarized bit string; selection of the group of context models depending on the values of the bits decoded so far in the binarized string.

In order to optimize the process of debinarization, it is possible to use predefined tree structures obtained by the Huffman method from statistics collected on a typical set of the encoded data. FIG. 2 shows the example of such the structure.

Figure 17:
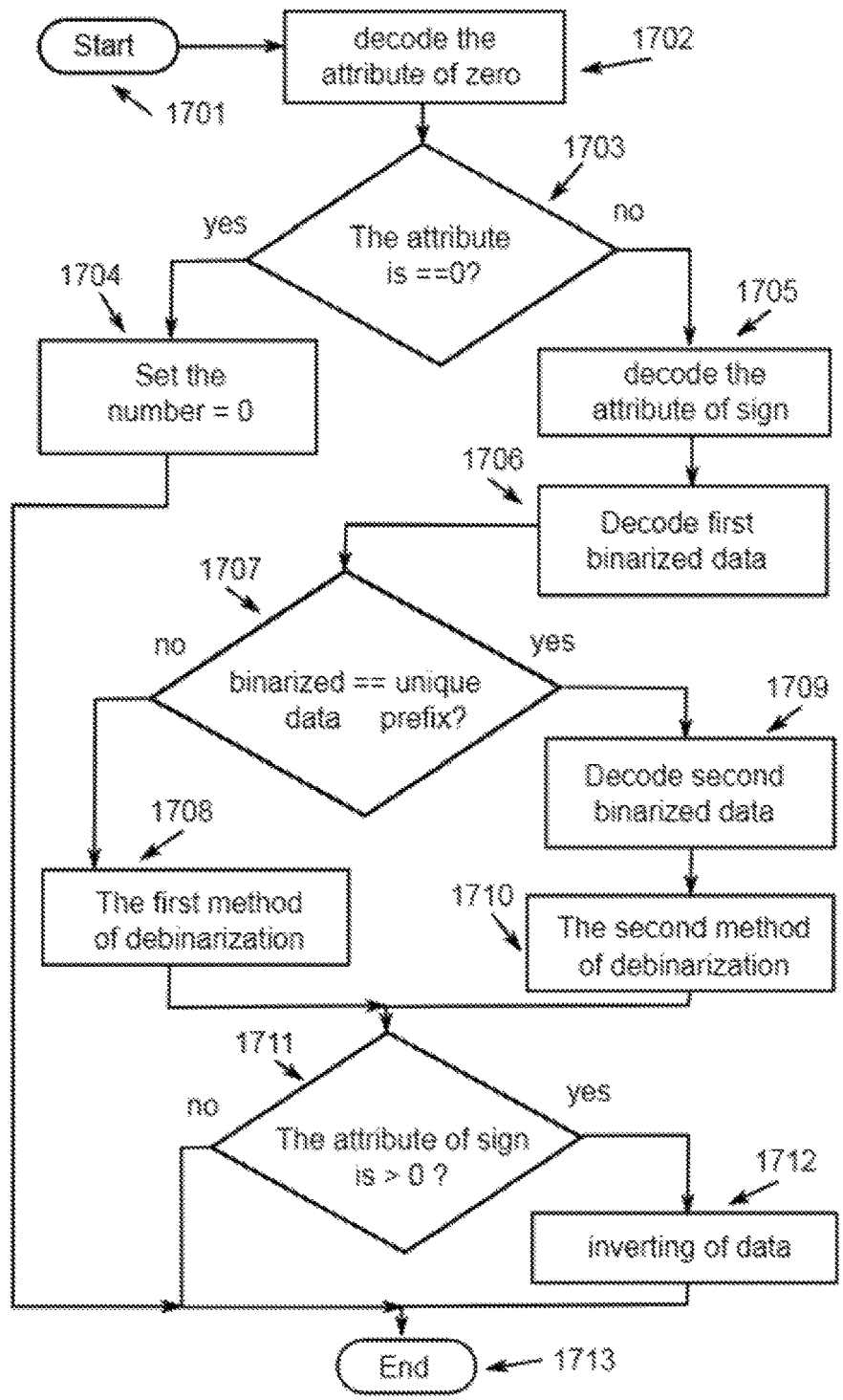
FIG. 17 shows a layout diagram of decoding and debinarization of a syntactic element in the form of an integer with a sign.

In order to optimize context modeling further, it is possible to use several methods of debinarization in the process of debinarization of one syntactic element. Furthermore, various context elements and various groups of the context models are selected, depending on a method of debinarization used and results of previous debinarization steps. As an example, let's consider a complex multistage process of decoding and debinarization of a syntactic element in the form of an integer with a sign (FIG. 17). At a beginning of the process (1701), the zero attribute is decoded (1702). The zero attribute is decoded by an individual group of context models, the context elements for which are obtained from the values of zero attribute and significance attribute decoded so far and from the position of the decoded syntactic element in the data stream. If the zero attribute is set (1703), the output value is set as equal to zero (1704), and the process of decoding is completed (1713). Otherwise, the sign attribute is decoded (1705). The sign attribute is decoded by the individual group of context models, the context elements for which are obtained from the sign attributes decoded so far and from the position of the decoded syntactic element in the data stream. Then, the first binarized data string is decoded (1706) that is binarized by the first method. The decoded string may be, for example, a tree structure obtained by the Huffman method from statistics collected on the typical set of the encoded data (FIG. 2). Furthermore, decoding is carried out by the individual group of context models which context elements are obtained from the values of the earlier decoded syntactic elements, the position of the decoded syntactic element and the sign attribute of the decoded value. Then, a check is conducted (1707) whether the decoded string is equal to a predefined unique prefix. If the decoded string is not equal to the predefined unique prefix, the decoded string is debinarized according to the first method of debinarization (1708). Otherwise, the next binarized string is decoded (1709). An additional binarized string is decoded by the individual group of context models which context elements are obtained from the values of the earlier decoded syntactic elements, the position of the decoded syntactic element and the sign attribute of the decoded value. Then, the decoded additional string is debinarized (1710) according to an alternative method of debinarization, for example, the Elias gamma code [1] (106). Then, the predefined value is added to the debinarized value obtained by that alternative method. Irrespective of the method of debinarization used, a check of the sign attribute is conducted (1711), and if the sign attribute is established, the decoded data is inverted (1712), after which decoding is completed (1713).

Figure 18:
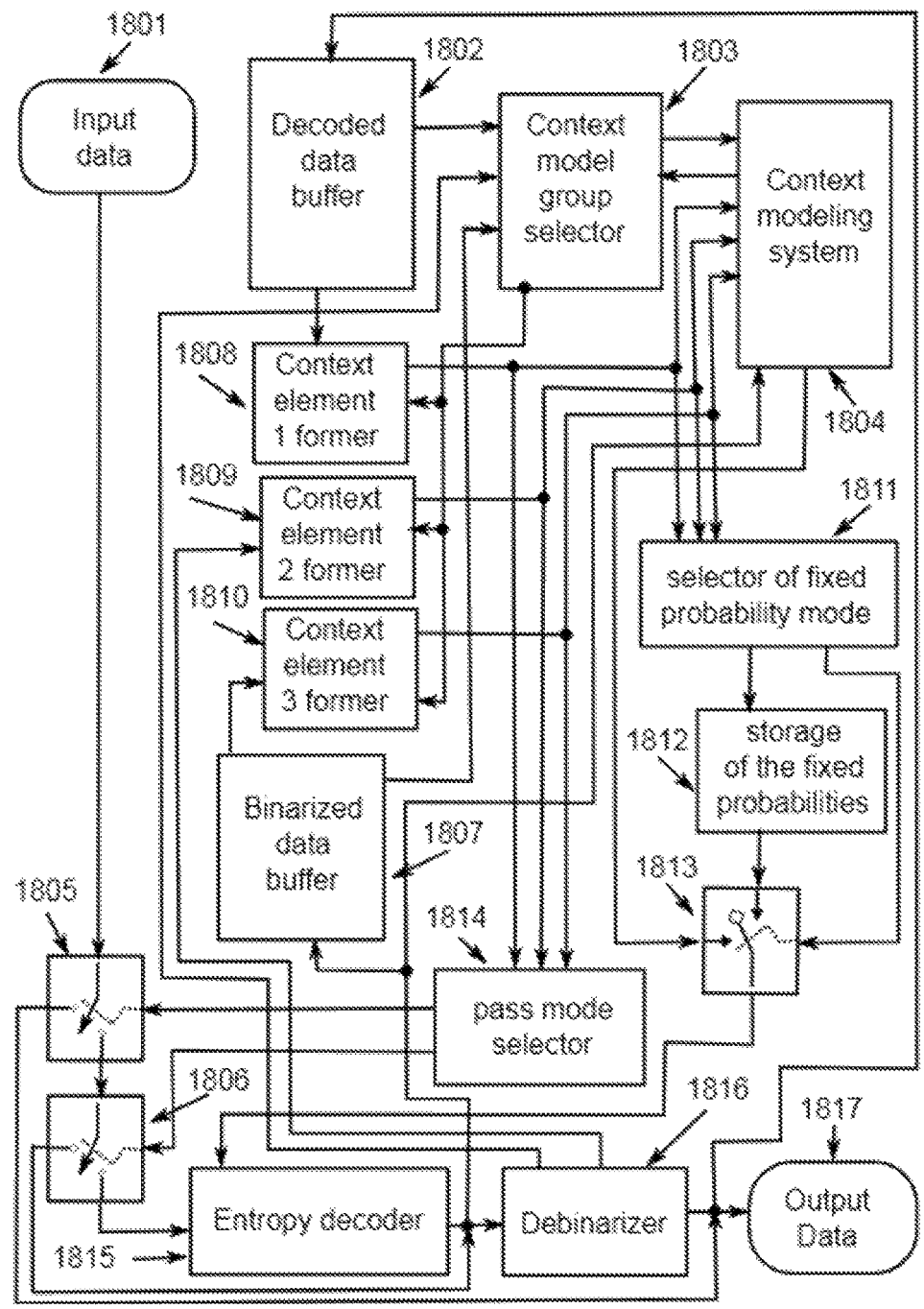
FIG. 18 shows a variant of a decoding diagram, wherein a portion of syntactic elements or a portion of bits of binarized syntactic elements are taken from a data stream without the step of entropy decoding and/or decoded by using predefined values of probability.

Important variants of the proposed method of decoding are those, wherein a portion of the syntactic elements or a portion of the bits in the binarized syntactic elements, depending on the value of at least one context element associated therewith, are taken from the data stream, bypassing the step of entropy decoding (FIG. 18). The practical meaning of this technical approach is acceleration of work of the entropy decoder in respect of those bits of the initial string that may not be efficiently encoded by the entropy encoding method.

An input data stream (1801) passing through two pass switches (1805, 1806) is decoded by an entropy decoder (1815). The decoded binarized data is sent to an input of a debinarizer (1816) and, at the same time, stored in a binarized data buffer (1807). The debinarized syntactic elements are transferred to an output data stream (1817) and, at the same time, stored in a decoded data buffer (1802). A context model group selector (1803) selects, on the basis of values of the earlier decoded syntactic elements, and/or the debinarization rules, and/or values of the binarized data decoded so far, and/or position and type of the decoded syntactic element in the data stream, the group of context models and transfers it to a context modeling system (1804) that uses the groups of context models. At the same time, context element formers (1808, 1809, 1810) form at least two context elements that are individual for the selected groups of context models. The context elements may be formed from the values of the earlier decoded syntactic elements (corresponds to (1808)), and/or on the basis of the debinarization rules (corresponds to (1809)), and/or the values of the binarized data decoded so far (corresponds to (1810)), and/or from the position and type of the decoded syntactic element in the data stream. A pass mode selector (1814) forms, on the basis of the values of the context elements (correspond to (1808, 1809, 1810)), a pass signal which is transferred to the syntactic element pass switch (1805) and/or to the pass switch for bits of the binarized string (1806). The syntactic element pass switch (1805) transfers the selected syntactic element to the output data stream (1817), bypassing the subsequent step of decoding. The pass switch for bits of the binarized string (1806) transfers the selected bits from the input string to the input of the debinarizer (1816), bypassing the entropy decoder (1815). If no one of the bypass routes is selected, the input data is transferred to the entropy decoder (1815) where it is decoded with the use of the probability predicted by the context modeling system (1804).

An important variant of the proposed method of passing the bits is that wherein the syntactic element pass switch (1805) and/or the pass switch for bits of the binarized string (1806) are switched depending on the obtained probability of a given bit. The context model group processor (1804) selects, using the values of the counters of a context occurrence number in the corresponding cells of the corresponding context models, the current context model and reads off the probability. If the probability thus obtained is within the range set by predefined values, and/or the context counter has a value which is greater or smaller than a predefined value, then entropy decoding is not carried out, and the value of the bit transfers, through the pass switch for bits of the binarized string (1806) from the input stream to the input of the debinarizer (1816), bypassing the entropy decoder (1815), or, if the binary syntactic element is decoded, the value of this syntactic element is transferred, through the syntactic element pass switch (1805), to the output data stream (1817), bypassing the subsequent step of decoding.

There are some variants of the proposed method of decoding, wherein a portion of the syntactic elements or a portion of the bits of the binarized syntactic elements are decoded, depending on the value of at least one context element associated therewith, with the use of predefined values of the probability (FIG. 18). The input data stream (1801) is decoded by the entropy decoder (1815). The decoded binarized data is passed to the input of the debinarizer (1816) and, at the same time, stored in the binarized data buffer (1807). The debinarized syntactic elements are transferred to the output data stream (1817) of the decoded syntactic elements and, at the same time, stored in the decoded data buffer (1802). The context model group selector (1803) selects, on the basis of the values of the earlier decoded syntactic elements, and/or the binarization rules, and/or the values of the binarized data decoded so far, and/or the position and type of the decoded syntactic element in the data stream, the group of context models and transfers it to the context modeling system (1804) that uses the groups of context models. At the same time, the context element formers (1808, 1809, 1810) form at least two context elements that are individual for the selected groups of context models. The context elements may be formed on the basis of the values of the earlier decoded syntactic elements (corresponds to (1808)), and/or the debinarization rules (corresponds to (1809)), and/or the values of the binarized data decoded so far (corresponds to (1810)), and/or from the position and type of the encoded syntactic element in the data stream. A selector of fixed probability mode (1811) forms, on the basis of the values of the context element (correspond to (1808, 1809, 1810)), a decoding signal with the fixed probability that is transferred to a fixed probability selection switch (1813) and, at the same time, to a storage of the fixed probabilities (1812) where the fixed probability, as associated with the values of the context elements, is selected. The probability thus obtained is used for decoding of the current binarized bit in the entropy decoder (1815).

As disclosed earlier in the preferred embodiments of the method for decoding syntactic elements of a data stream, the corresponding decoder for decoding syntactic elements of the data stream comprises the entropy decoder (802, 1815), the binarized data buffer (804, 1807), the decoded data buffer (803, 1802), the context model group selector (805, 1803), the context model group repository (806), the context model group processor (811), the context element formers (808, 809, 810, 1808, 1809, 1810), the model update module (812), and the context mixing module (807).

The decoder may further comprise the debinarizer (813, 1816) for debinarization of the binarized syntactic elements. In particular embodiments, which are described in detail earlier, the decoder may further comprise at least one of: the selector of fixed probability mode (1811), the syntactic element pass switch (1805), the pass switch for bits of the binarized string (1806), the pass mode selector (1814).

It will be appreciated by those skilled in the art that the decoder may be implemented at the hardware level, i.e. with the use of electronic components. Alternatively, the decoder may be implemented at the hardware-software level, for example, with the use of programmable logic devices. The decoder may also be fully implemented at the software level, i.e. be a program code executed in a computer, or a mobile electronic device, or an embedded electronic device, or in another similar device comprising a processor for executing commands, transitory and/or non-transitory memory etc., which is also well known to and understandable by those skilled in the art.

Also, those skilled in the art will appreciate that the encoder and the decoder, as described earlier, in any their embodiments may be both individual objects independent of each other, or form a single object. An example of the single object may be a encoder-decoder for encoding-decoding, as implemented at the software-hardware level, for example, with of programmable logic devices (PLD). Another implementation example of the encoder-decoder as a single object may be an application program for a mobile electronic device or a computer. Also, said encoder-decoder may be a hardware encoder-decoder having common or separate electronic units and/or used as a board for expanding functionality of an electronic device. Other variants of joint or individual implementation of the encoder and the decoder are also possible.

REFERENCES

[1] ISBN 0521642981, David J. C. MacKay, Information Theory, Inference and Learning Algorithms
[2] Nelson, Mark et al. The Data Compression Book, Second Edition. M&T Books, 5 pages, XP-002615565, 1995.
[3] G. Nigel N. Martin. Range encoding: An algorithm for removing redundancy from a digitized message. Video & Data Recording Conference, Southampton, UK, Jul. 24-27, 1979.
[4] Langdon, et al. U.S. Pat. No. 4,122,440, Oct. 24, 1978.
[5] G. J. Sullivan. Overview of the High Efficiency Video Coding (HEVC) Standard. IEEE Trans. on Circuits and Systems for Video Technology.
[6] Mokrushin. U.S. Pat. No. 8,374,446, Feb. 12, 2013.
[7] Marpe, D., Schwarz, H., and Wiegand, T. Context-Based Adaptive Binary Arithmetic Coding in the H.264/AVC Video Compression Standard. IEEE Trans. Circuits and Systems for Video Technology, Vol. 13, No. 7, pp. 620-636, July, 2003.
[8] V. Sze, and M. Budagavi. High Throughput CABAC Entropy Coding in HEVC. IEEE Trans. on Circuits & System for Video Tech., vol. 22(12), 2012.
[9] Sekiguchi, et al. U.S. Pat. No. 7,928,869, Apr. 19, 2011.
[10] Sekiguchi, et al. U.S. Pat. No. 7,859,438, Dec. 28, 2010.
[11] Sekiguchi, et al. U.S. Pat. No. 8,094,049, Jan. 10, 2012.
[12] Hu, et al. U.S. Pat. No. 7,245,242, Jul. 17, 2007.
[13] Marpe, Detlev, et al. US Patent Application 20050038837, Feb. 17, 2005.
[14] Bossen; Frank. US Patent Application 20130028334, Jan. 31, 2013.
[15] Hsieh, et al. U.S. Pat. No. 7,557,740, Jul. 7, 2009.
[16] Cai, et al. U.S. Pat. No. 7,245,241, Jul. 17, 2007.
[17] Cai, et al. U.S. Pat. No. 7,629,904, Dec. 8, 2009.

What is claimed is:

1. A method of decoding of syntactic elements of a data stream, wherein:
before beginning of decoding of the data stream, cells of all context models are initialized with predefined values, so that each context model contains in each cell thereof data on a probability and a counter of a context occurrence number, a number of cells stored in each context model is selected to be not less than a number of all possible states of context elements associated with a respective context model, and
in the process of decoding of at least a portion of bits of the data stream:
a group of context models is selected, said group of context models comprising at least two context models of different size;
values of at least two context elements associated with the selected group of context models are calculated;
selection of the cells in the context models is carried out by means of values of the context elements associated with the respective context model;
one context model is selected from the group of context models using values of individual counters of a context occurrence number stored in the selected cells;
the data on the probability is extracted from the selected cell of the selected context model, said data being used for entropy decoding of a current bit in the data stream, and/or for selecting a mode of direct extraction of decoded bits from the data stream;
data in the selected cell of the selected context model as well as in all the context models of the group of context models, which have a size greater than that of the selected context model, is updated; and
a procedure of probability inheritance from the selected context model is carried out in respect of the selected cells of those context models of the group of context models for which predefined inheritance criteria are met.

2. The method of decoding according to claim 1, wherein if it is impossible to determine the value of at least one context element for some bits of the data stream, the values for such context elements are determined by predefined values.

3. The method of decoding according to claim 1, wherein at least one context model has the size of $2^i$ cells, where i is a natural integer.

4. The method of decoding according to claim 1, wherein the procedure of selecting the context model from the group of context models is carried out by successively viewing values of individual counters of a context occurrence number in the selected cells, starting from the biggest context model and until a value of the current counter of a context occurrence number becomes greater than a predefined value, or until the context model of the least size is reached.

5. The method of decoding according to claim 1, wherein the procedure of selecting the context model from the group of context models is carried out by successively viewing values of individual counters of a context occurrence number in the selected cells, starting from the smallest context model and until a value of the counter of a context occurrence number becomes less than a predefined value, or until the context model of the biggest size is reached.

6. The method of decoding according to claim 1, wherein a step of updating the value of the probability in the context is changed depending on the value of the counter of a context occurrence number for this context.

7. The method of decoding according to claim 1, wherein after the counter of a context occurrence number reaches one or more predefined values, a method of updating the probability is changed for this context, wherein a total number of the methods of updating the probability is more than one.

8. The method of decoding according to claim 1, wherein after the counter of a context occurrence number reaches a predefined value, updating of values of the counter of a context occurrence number for this context is stopped.

9. The method of decoding according to claim 1, wherein before the beginning of decoding, at least one context model in at least one group of context models is initialized with data read from the data stream.

10. The method of decoding according to claim 1, wherein nonbinary syntactic elements of the data stream are debinarized in the process of decoding.

11. The method of decoding according to claim 1, wherein in the process of decoding
at least one decoded syntactic element is debinarized, and
at least two groups of context models are selected using a current ordinal number of the bit in a binarized string.

12. The method of decoding according to claim 1, wherein in the process of decoding:

at least one decoded syntactic element is debinarized, and at least one context element is calculated using values of the already decoded bits of a binarized string.

13. The method of decoding according to claim 1, wherein in the process of decoding:

at least one decoded syntactic element is debinarized, and at least two groups of context models are selected using values of the already decoded bits of a binarized string.

14. The method of decoding according to claim 1, wherein in the process of decoding:

at least one decoded syntactic element is debinarized, and at least one context element is calculated using values of earlier decoded and restored syntactic elements and/or values of earlier decoded and debinarized bits of a current syntactic element.

15. The method of decoding according to claim 1, wherein in the process of decoding:

at least one decoded syntactic element is debinarized, and at least two groups of context models are selected using values of earlier decoded and restored syntactic elements and/or values of earlier decoded and debinarized bits of a current syntactic element.

16. The method of decoding according to any one of claims 10 to 13, wherein debinarization of at least one syntactic element is carried out using a predefined Huffman tree.

17. The method of decoding according to any one of claims 10 to 15, wherein at least one bit of a currently decoded and debinarized syntactic element, depending on a value of at least one context element associated therewith, and/or depending on values of the probability calculated, and/or depending on a value of an individual counter of context occurrence number, is read from the data stream directly, bypassing the step of decoding; and the value of at least one context element, and/or at least one value of the probability, and/or the value of at least one counter of a context occurrence number are updated with the use of a value of the bit obtained.

18. The method of decoding according to any one of claims 10 to 15, wherein at least one bit of a currently decoded and debinarized syntactic element, depending on a value of at least one context element associated therewith, is decoded from the data stream with the use of predefined fixed values of the probability.

19. The method of decoding according to any one of claims 12 to 15, wherein in order to debinarize at least one syntactic element, depending on values of the already decoded bits of the syntactic element, two or more independent methods of debinarization are used;

at least two context elements are calculated with the use of binarized values obtained by various methods of binarization; and/or at least one context element is calculated by a current ordinal number of the decoded bit in a binarized string from which the current syntactic element is debinarized.

20. The method of decoding according to any one of claims 12 to 15, wherein in order to debinarize at least one syntactic element, depending on the already decoded bits of the syntactic element, two or more independent methods of debinarization are used;

at least two groups of context models are selected using binarized values obtained by various methods of binarization; and/or at least two groups of context models are selected by a current ordinal number of the decoded bit in a binarized string from which the current syntactic element is debinarized.

21. The method of decoding according to claim 19, wherein decoding of a bit string encoded with unary codes, and/or Hyffman codes, and/or Golomb codes, and/or universal codes in various combinations is used as the methods of debinarization.

22. The method of decoding according to any claim 19, wherein in order to debinarize and decode values of the syntactic elements with a sign, decoding of a zero attribute by the unary method, or decoding of a sign attribute by the unary method, or decoding of an absolute value of the syntactic element by the unary method or the Huffman method is used, provided that said value is not equal to zero and does not exceed, in absolute value, a predefined value; or decoding of absolute values which are greater than a predefined value by the Elias gamma code method or the Golomb exponential code method is used, and a change of the sign of the decoded value in accordance with the decoded sign attribute is used to restore the sign of the current syntactic element being not equal to zero.

23. The method of decoding according to claim 20, wherein decoding of a bit string encoded with unary codes, and/or Hyffman codes, and/or Golomb codes, and/or universal codes in various combinations is used as the methods of debinarization.

24. The method of decoding according to any claim 20, wherein in order to debinarize and decode values of the syntactic elements with a sign, decoding of a zero attribute by the unary method, or decoding of a sign attribute by the unary method, or decoding of an absolute value of the syntactic element by the unary method or the Huffman method is used, provided that said value is not equal to zero and does not exceed, in absolute value, a predefined value; or decoding of absolute values which are greater than a predefined value by the Elias gamma code method or the Golomb exponential code method is used, and a change of the sign of the decoded value in accordance with the decoded sign attribute is used to restore the sign of the current syntactic element being not equal to zero.

25. The method of decoding according to claim 1, wherein at least a portion of decoded syntactic elements forms a one-dimensional array, and/or a two-dimensional array, and/or a three-dimensional array; and at least one context element is calculated on the basis of a position of a decoded syntactic element in said arrays.

26. The method of decoding according to claim 1, wherein at least a portion of decoded syntactic elements forms a one-dimensional array, and/or a two-dimensional array, and/or a three-dimensional array; and at least two groups of context models are selected on the basis of a position of a decoded syntactic element in said arrays.

27. The method of decoding according to claim 1, wherein at least one context element is calculated using values of earlier decoded syntactic elements.

28. The method of decoding according to claim 1, wherein at least two groups of context models are selected using values of earlier decoded syntactic elements.

29. The method of decoding according to claim 1, wherein
at least one syntactic element, depending on a value of at least one context element associated therewith, and/or depending on values of the probability calculated, and/or depending on a value of an individual counter of context occurrence number, is read from the data stream directly, bypassing the step of decoding; and
a value of at least one context element, and/or a value of at least one probability, and/or a value of at least one counter of a context occurrence number are updated with the use of an obtained value of the syntactic element.

30. The method of decoding according to claim 1, wherein at least one syntactic element, depending on a value of at least one context element associated therewith, is decoded from the data stream using a predefined fixed value of the probability.

31. The method of decoding according to claim 1, wherein
a decoded data stream comprises the syntactic elements of various types; and
at least two groups of context models are selected on the basis of a type of decoded syntactic elements.

32. The method of decoding according to claim 1, wherein an arithmetic decoder and/or range decoder is used for the entropy decoding.

33. A decoder for decoding of syntactic elements of a data stream for carrying out the method of decoding of the syntactic elements of the data stream according to claim 1, comprising:
an entropy decoder,
a binarized data buffer,
a decoded data buffer,
a context model group selector,
a context model group repository,
a context model group processor,
context element formers,
a model update module, and
a context mixing module.

34. The decoder according to claim 33, further comprising a debinarizer for debinarization of binarized syntactic elements.

35. A method of encoding of syntactic elements of a data stream, wherein:
before beginning of encoding of the data stream, cells of all context models are initialized with predefined values, so that each context model contains in each cell thereof data on a probability and a counter of a context occurrence number, a number of the cells stored in each context model is selected to be not less than a number of all possible states of context elements associated with a respective context model, and
in the process of encoding of at least a portion of bits of the data stream:
a group of context models is selected that comprises at least two context models of different size;
values of at least two context elements associated the selected group of context models are calculated;
selection of the cells in context models is carried out using values of the context elements associated with the respective context model;
one context model is selected from the group of context models using values of individual counters of a context occurrence number stored in the selected cells;
the data on the probability is extracted from the selected cell of the selected context model, which data is used for entropy encoding of a current bit of the data stream, and/or for selecting a mode of writing encoded bits into the data stream directly;
data in the selected cell of the selected context model as well as in all the context models of the group of context models, which have a size greater than that of the selected context model, is updated; and
a procedure of probability inheritance from the selected context model is carried out in respect of the selected cells of those context models of the group of context models for which predefined inheritance criteria are met.

36. The method of encoding according to claim 35, wherein
if it is impossible to determine the value of at least one context element for some bits of the data stream, the values of such context elements are determined by predefined values.

37. The method of encoding according to claim 35, wherein
at least one context model has the size of $2^i$ cells, where i is a natural number.

38. The method of encoding according to claim 35, wherein
the procedure of selecting the context model from the group of context models is carried out by successively viewing values of individual counters of a context occurrence number in the selected cells, starting from the biggest context model and until a value of the individual counter of a context occurrence number becomes greater than a predefined value, or until the context model of the least size is reached.

39. The method of encoding according to claim 35, wherein
the procedure of selecting the context model from the group of context models is carried out by successively viewing values of individual counters of a context occurrence number in the selected cells, starting from the smallest context model and until a value of the individual counter of a context occurrence number becomes less than a predefined value, or until the context model of the biggest size is reached.

40. The method of encoding according to claim 35, wherein
a step of updating the value of the probability in the context is changed depending on the value of the counter of a context occurrence number for this context.

41. The method of encoding according to claim 35, wherein
after the counter of a context occurrence number reaches one or more predefined values, a method of updating the probability is changed for this context, wherein a total number of methods of updating the probability is more than one.

42. The method of encoding according to claim 35, wherein after the counter of a context occurrence number reaches a predefined value, updating of values of the counter of a context occurrence number for this context is stopped.

43. The method of encoding according to claim 35, wherein before the beginning of encoding, at least one context model in at least one group of context models is initialized with data written into an output data stream.

44. The method of encoding according to claim 35, wherein nonbinary syntactic elements of an input data stream are binarized in the process of encoding.

45. The method of encoding according to claim 35, wherein in the process of encoding at least one encoded syntactic element is binarized, and at least two groups of context models are selected using a current ordinal number of the bit in a binarized string.

46. The method of encoding according to claim 35, wherein in the process of encoding at least one encoded syntactic element is binarized, and at least one context element is calculated using values of the already encoded bits in a binarized string.

47. The method of encoding according to claim 35, wherein in the process of encoding at least one encoded syntactic element is binarized, and at least two groups of context models are selected using values of the already encoded bits in a binarized string.

48. The method of encoding according to claim 35, wherein in the process of encoding at least one encoded syntactic element is binarized, and at least one context element is calculated using values of the syntactic elements encoded so far and/or values of the already encoded bits of a current syntactic element.

49. The method of encoding according to claim 35, wherein in the process of encoding at least one encoded syntactic element is binarized, and at least two groups of context models are selected using values of the syntactic elements encoded so far and/or values of the already encoded bits of a current syntactic element.

50. The method of encoding according to any one of claims 44 to 47, wherein binarization of at least one syntactic element is carried out using a predefined Huffman tree.

51. The method of encoding according to any one of claims 44 to 49, wherein at least one bit of a currently encoded and binarized syntactic element, depending on a value of at least one context element associated therewith, and/or depending on values of the probability calculated, and/or depending on a value of an individual counter of a context occurrence number, is written into the data stream directly, bypassing the step of encoding.

52. The method of encoding according to any one of claims 44 to 49, wherein at least one bit of a currently encoded binarized syntactic element, depending on a value of at least one context element associated therewith, is encoded into the data stream with the use of predefined fixed values of the probability.

53. The method of encoding according to any one of claims 46 to 49, wherein in order to binarize at least one syntactic element, depending on values of the already encoded bits of the syntactic element, two or more independent methods of binarization are used;

at least two context elements are calculated using binarized values obtained by various methods of binarization; and/or at least one context element is calculated using a current ordinal number of the encoded bit in a binarized string obtained from a current syntactic element.

54. The method of encoding according to any one of claims 46 to 49, wherein in order to binarize at least one syntactic element, depending on values of the already encoded bits of the syntactic element, two or more independent methods of binarization are used;

at least two groups of context models are selected using binarized values obtained by various methods of binarization; and/or at least two groups of context models are selected by a current ordinal number of the encoded bit in a binarized string obtained from a current syntactic element.

55. The method of encoding according claim 53, wherein unary encoding, and/or encoding according to the Huffman method, and/or encoding by the Golomb code, and/or encoding by the universal code, is used in various combinations as the methods of binarization.

56. The method of encoding according to claim 53, wherein for binarization and encoding of values of the syntactic elements with a sign, unary encoding of a zero attribute; or unary encoding of the sign; or encoding of an absolute value of the syntactic element by the unary method or the Huffman method, provided that value is not equal to zero and does not exceed, in absolute value, a predefined value; or encoding of absolute values which are greater than a predefined quantity, by the Elias gamma code method or by the Golomb exponential code method, is used.

57. The method of encoding according to claim 54, wherein unary encoding, and/or encoding according to the Huffman method, and/or encoding by the Golomb code, and/or encoding by the universal code, is used in various combinations as the methods of binarization.

58. The method of encoding according to claim 54, wherein for binarization and encoding of values of the syntactic elements with a sign, unary encoding of a zero attribute; or unary encoding of the sign; or encoding of an absolute value of the syntactic element by the unary method or the Huffman method, provided that value is not equal to zero and does not exceed, in absolute value, a predefined value; or encoding of absolute values which are greater than a predefined quantity, by the Elias gamma code method or by the Golomb exponential code method, is used.

59. The method of encoding according to claim 35, wherein at least a portion of encoded syntactic elements forms a one-dimensional array, and/or a two-dimensional array, and/or a three-dimensional array; and at least one context element is calculated on the basis of a position of an encoded syntactic element in said arrays.

60. The method of encoding according to claim 35, wherein at least a portion of encoded syntactic elements forms a one-dimensional array, and/or a two-dimensional array, and/or a three-dimensional array; and at least two groups of context models are selected on the basis of a position of an encoded syntactic element in said arrays.

61. The method of encoding according to claim 35, wherein at least one context element is calculated using values of the syntactic elements encoded so far.

62. The method of encoding according to claim 35, wherein at least two groups of context models are selected using values of the syntactic elements encoded so far.

63. The method of encoding according to claim 35, wherein at least one syntactic element, depending on a value of at least one context element associated therewith, and/or depending on values of the probability calculated, and/or depending on a value of an individual counter of context occurrence number, is written into the data stream directly, bypassing the step of encoding.

64. The method of encoding according to claim 35, wherein at least one syntactic element, depending on the value of at least one context element associated therewith, is encoded into the data stream by using a predefined fixed value of the probability.

65. The method of encoding according to claim 35, wherein an encoded data stream comprises the syntactic elements of various types, and at least two groups of context models are selected on the basis of a type of the encoded syntactic element.

66. The method of encoding according to claim 35, wherein an arithmetic encoder and/or range encoder are used for the entropy encoding.

67. An encoder for encoding of syntactic elements of a data stream for carrying out the method of encoding of the syntactic elements of the data stream according to claim 35, comprising:

an entropy coder, an input data buffer, a binarized data buffer, a context model group selector, a context model group repository, a context model group processor, context element formers, a model update module, and a context mixing module.

68. The encoder according to claim 67, further comprising a binarizer for binarization of nonbinary syntactic elements.

* * * * *